(12) United States Patent
Zhang et al.

(10) Patent No.: US 11,812,645 B2
(45) Date of Patent: Nov. 7, 2023

(54) DISPLAY PANEL AND DISPLAY DEVICE

(71) Applicant: Xiamen Tianma Micro-Electronics Co., Ltd., Xiamen (CN)

(72) Inventors: Zhengchuan Zhang, Wuhan (CN); Huangyao Wu, Xiamen (CN); Hao Dai, Wuhan (CN); Hai Liu, Shanghai (CN)

(73) Assignee: XIAMEN TIANMA MICRO ELECTRONICS CO., LTD., Xiamen (CN)

( * ) Notice: Subject to any disclaimer, the term of this patent is extended or adjusted under 35 U.S.C. 154(b) by 275 days.

(21) Appl. No.: 17/400,664

(22) Filed: Aug. 12, 2021

(65) Prior Publication Data
US 2022/0344436 A1    Oct. 27, 2022

(30) Foreign Application Priority Data
Apr. 22, 2021   (CN) .......................... 202110435279.6

(51) Int. Cl.
*H01L 29/08*     (2006.01)
*H10K 59/131*    (2023.01)
*H10K 59/122*    (2023.01)
*H10K 59/121*    (2023.01)

(52) U.S. Cl.
CPC ......... *H10K 59/131* (2023.02); *H10K 59/122* (2023.02); *H10K 59/1216* (2023.02)

(58) Field of Classification Search
CPC . H10K 59/131; H10K 59/122; H10K 59/1216
USPC ........................................................... 257/40
See application file for complete search history.

(56) References Cited

U.S. PATENT DOCUMENTS

2012/0146004 A1* 6/2012 Lee ..................... H01L 27/1255
                                                      438/34

FOREIGN PATENT DOCUMENTS

| CN | 108039357 A | * | 5/2018 | ......... H01L 27/3225 |
| CN | 110473503 A | | 11/2019 | |
| CN | 111627976 A | | 9/2020 | |

* cited by examiner

*Primary Examiner* — Phuc T Dang
(74) *Attorney, Agent, or Firm* — ANOVA LAW GROUP PLLC

(57) ABSTRACT

A display panel and a display device are provided. The display panel includes a substrate; a driving circuit layer, disposed on the substrate and including a reset signal line and a first power signal line; a light-emitting element layer, including organic light-emitting elements, wherein each organic light-emitting element includes a first electrode, a light-emitting layer, and a second electrode, and the light-emitting layer includes a first common layer, a light-emitting material layer and a second common layer; and a compensation capacitor, disposed between at least two adjacent organic light-emitting elements and including a first plate and a second plate insulated from each other, wherein the first plate is disposed on a side of the first common layer facing the substrate and in contact with the first common layer and electrically connected with the reset signal line, and the second plate is electrically connected with the first power signal line.

20 Claims, 24 Drawing Sheets

DISPLAY PANEL AND DISPLAY DEVICE

CROSS-REFERENCE TO RELATED APPLICATION

This application claims the priority of Chinese Patent Application No. 202110435279.6, filed on Apr. 22, 2021, the content of which is incorporated by reference in its entirety.

TECHNICAL FIELD

The present disclosure generally relates to the field of display technology and, more particularly, relates to a display panel and a display device.

BACKGROUND

When an existing organic light-emitting display panel displays a certain monochrome image, pixels of other adjacent colors slightly emit light, which causes a crosstalk between organic light-emitting elements of different colors and affects the light-emitting quality of the display panel.

The disclosed display panels and display devices are directed to solve one or more problems set forth above and other problems in the art.

SUMMARY

One aspect of the present disclosure provides a display panel. The display panel may include a substrate; a driving circuit layer, disposed on the substrate and including a reset signal line and a first power signal line; a light-emitting element layer, including a plurality of organic light-emitting elements, wherein each of the plurality of organic light-emitting elements includes a first electrode, a light-emitting layer, and a second electrode disposed on the driving circuit layer, and the light-emitting layer includes a first common layer, a light-emitting material layer and a second common layer; and a compensation capacitor, disposed between at least two adjacent organic light-emitting elements of the plurality of light-emitting elements, wherein the compensation capacitor includes a first plate and a second plate that are insulated from each other, the first plate is disposed on a side of the first common layer facing the substrate and is in contact with the first common layer, the first plate is electrically connected with the reset signal line, and the second plate is electrically connected with the first power signal line.

Another aspect of the present disclosure provides a display device. The display device may include a display panel. The display panel may include a substrate; a driving circuit layer, disposed on the substrate and including a reset signal line and a first power signal line; a light-emitting element layer, including a plurality of organic light-emitting elements, wherein each of the plurality of organic light-emitting elements includes a first electrode, a light-emitting layer, and a second electrode disposed on the driving circuit layer, and the light-emitting layer includes a first common layer, a light-emitting material layer and a second common layer; and a compensation capacitor, disposed between at least two adjacent organic light-emitting elements of the plurality of light-emitting elements, wherein the compensation capacitor includes a first plate and a second plate that are insulated from each other, the first plate is disposed on a side of the first common layer facing the substrate and is in contact with the first common layer, the first plate is electrically connected with the reset signal line, and the second plate is electrically connected with the first power signal line.

Other aspects of the present disclosure can be understood by those skilled in the art in light of the description, the claims, and the drawings of the present disclosure.

BRIEF DESCRIPTION OF THE DRAWINGS

To more clearly illustrate the technical solutions in the embodiments of the present disclosure or the prior art, the following will briefly introduce the drawings needed in the description of the embodiments or prior art. Obviously, the drawings in the following description are only exemplary embodiment of the present disclosure. For those of ordinary skill in the art, other drawings can be obtained according to the provided drawings without creative work.

Figure 1:
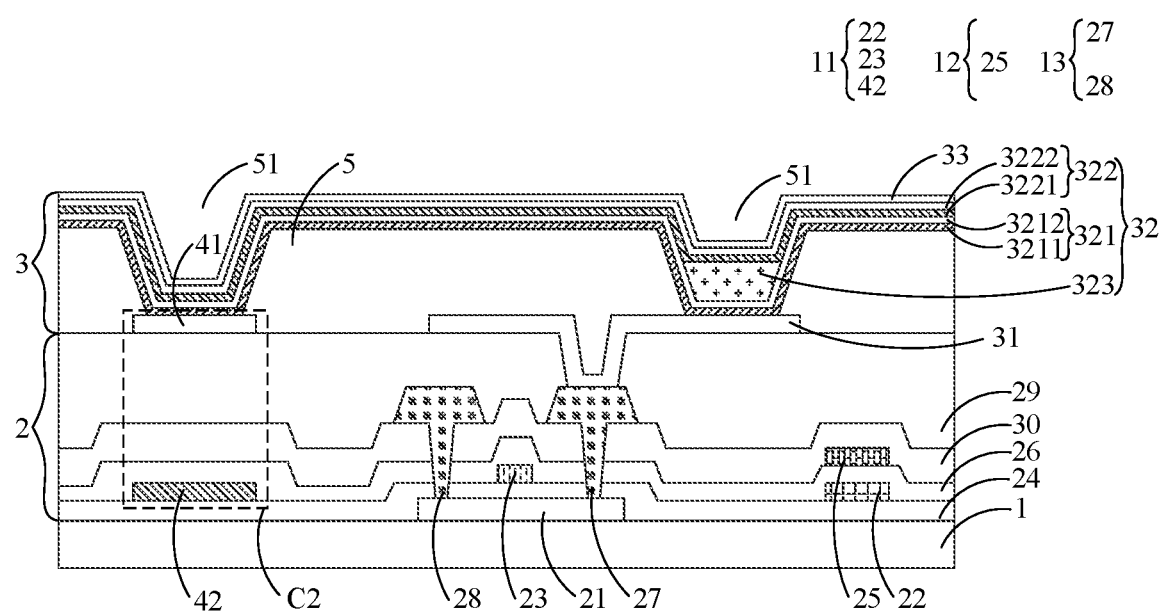
FIG. 1 illustrates a layer structure of an exemplary display panel according to various disclosed embodiments of the present disclosure.

In the drawings: 1-substrate; 2-driving circuit layer; 20-fourth insulation layer; 21-active layer; 22-bottom plate; 23-gate electrode; 24-first insulation layer; 25-top plate; 26-second insulation layer; 27-source electrode; 28-drain electrode; 29-planarization layer; 30-third insulation layer; 11-first metal layer; 12-second metal layer; 13-third metal layer; 14-fourth metal layer; 3-light-emitting element layer; 31-first electrode; 32-light-emitting layer; 33-second electrode; 321-first common layer; 322-second common layer; 3211-hole injection layer; 3212-hole transport layer; 3213-electron barrier layer; 3221-electron transport layer; 3222-electron injection layer; 3223-hole barrier layer; 323-light-emitting material layer; 40-sub-portion; 41-first plate; 42-second plate; 5-pixel definition layer; 51-first opening; 6-red organic light-emitting element; 7-green organic light-emitting element; 8-blue organic light-emitting element; 100-first reset module; 200-driving module; 300-data writing module; 400-threshold compensation module; 401-first sub-module; 402-second sub-module; 500-light-emitting control module; 501-first light-emitting control sub-module; 502-second light-emitting control sub-module; 600-second reset module; 9-display device; 15-first organic light-emitting element group; 16-second organic light-emitting element group; 17-first organic light-emitting element row; and 18-second organic light-emitting element row.

DETAILED DESCRIPTION

The features and exemplary embodiments of various aspects of the present disclosure will be described in detail below. In the following detailed description, many specific details are proposed to provide a comprehensive understanding of the present disclosure. However, it is obvious to those skilled in the art that the present disclosure can be implemented without some of these specific details. The following description of the embodiments is only to provide a better understanding of the present disclosure by showing examples of the present disclosure.

It should be noted that in this disclosure, relational terms, such as first and second, are only used to distinguish one entity or operation from another entity or operation, and do not necessarily require or imply one of these entities or operations to have any such actual relationship or order between them. Moreover, the terms "include", "containing" or any other variants thereof are intended to cover non-exclusive inclusion, such that a process, method, article, or device including a series of elements not only includes those elements, but also includes those that are not explicitly listed, or also include elements inherent to this process, method, article, or equipment. If there are no more restrictions, the elements defined by the sentence "including . . ." do not exclude the existence of other identical elements in the process, method, article, or equipment that includes the elements.

The present disclosure provides a display panel and a display device. To better understand the present disclosure, the display panel, and the display device according to the embodiments of the present disclosure will be described in detail below with reference to FIGS. 1 to 31.

Figure 2:
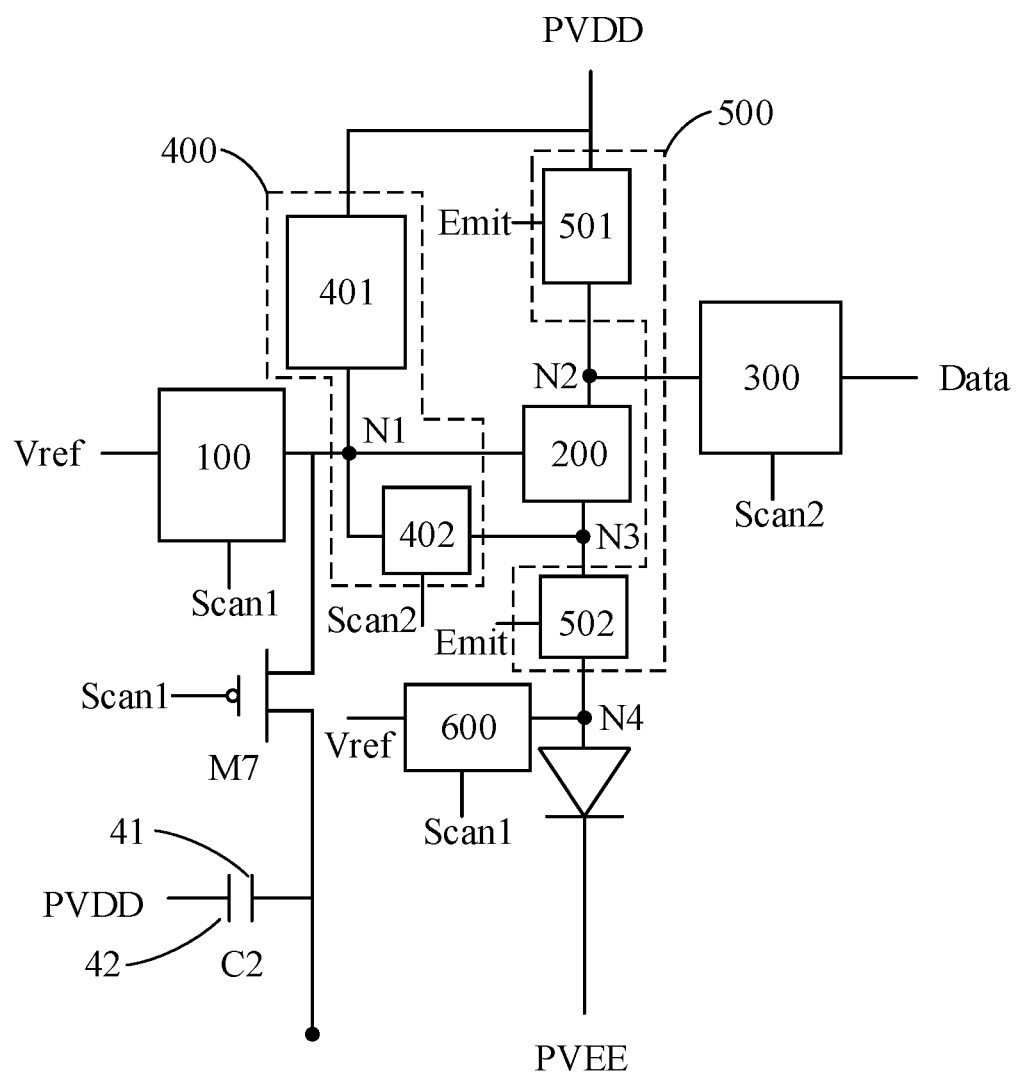
FIG. 2 illustrates an exemplary driving circuit according to various disclosed embodiments of the present disclosure.

FIG. 1 illustrates a layer structure of an exemplary display panel according to various disclosed embodiments of the present disclosure. FIG. 2 illustrates an exemplary driving circuit according to various embodiments of the present disclosure.

As shown in FIG. 1 and FIG. 2, the display panel may include a substrate 1, a driving circuit layer 2, a light-emitting element layer 3, and a compensation capacitor C2. The driving circuit layer 2 may be disposed on the substrate 1; and may include a reset signal line Vref and a first power signal line PVDD. The light-emitting element layer 3 may include a plurality of organic light-emitting elements, and each organic light-emitting element may include a first electrode 31, a light-emitting layer 32 and a second electrode 33 disposed on the driving circuit layer 2. The light-emitting layer 32 may include a first common layer 321, a light-emitting material layer 323, and a second common layer 322. The compensation capacitor C2 may be disposed between at least two adjacent organic light-emitting elements. The compensation capacitor C2 may include a first plate 41 and a second plate 42. The first plate 41 may be disposed on the side of the first common layer 321 facing the substrate 1 and may be in contact with the first common layer 321. The first plate 41 may be electrically connected to the reset signal line Vref (connected by a wire or through a transistor, as long as a signal transmission can be achieved). The second plate 42 may be electrically connected with the first power signal line PVDD.

In the above display panel, the compensation capacitor C2 may be disposed between at least two adjacent organic light-emitting elements. The compensation capacitor C2 may include the first electrode plate 41 and the second electrode plate 42. The first electrode plate 41 may be in contact with the first common layer 321. The second electrode plate 42 may be electrically connected to the first power signal line PVDD such that, when the organic light-emitting element adjacent to the compensation capacitor C2 emits light, the leakage current in the first common layer 321 may be stored in the compensation capacitor C2 to prevent the leakage current of the organic light-emitting element from affecting the adjacent organic light-emitting elements. Accordingly, the light-emission of the organic light-emitting elements disposed on both sides of the compensation capacitor C2 may be independent from each other, and may not affect each other. At the same time, the first plate 41 and the reset signal line Vref may be electrically connected such that the compensation capacitor C2 may be reset by the reset signal of the reset signal line Vref to ensure the leakage current storage effect of the compensation capacitor C2 after a long-term use. The display panel provided in the present disclosure may effectively prevent or reduce the light-emitting crosstalk between adjacent organic light-emitting elements. Thus, the display effect of the display panel in a low grayscale state may be significantly enhanced, and the display effect of the display panel may be improved.

Figure 3:
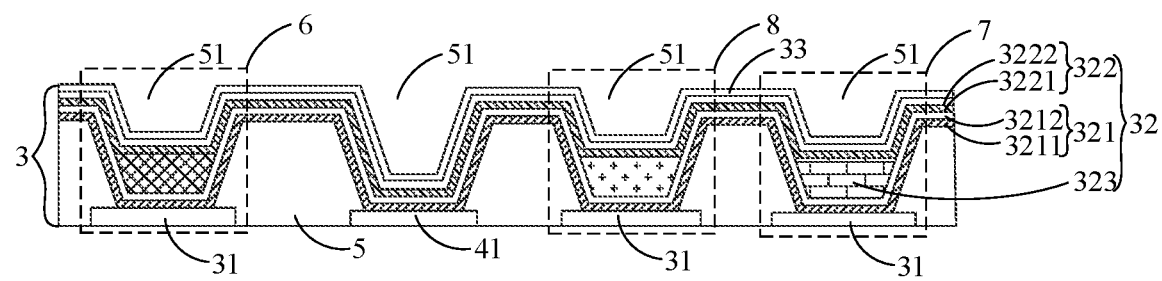
FIG. 3 illustrates a light-emitting layer of an exemplary display panel according to various disclosed embodiments of the present disclosure.

FIG. 3 illustrates a layer structure of an exemplary light-emitting element layer of a display panel according to various disclosed embodiments of the present disclosure. As shown in FIG. 2 and FIG. 1, the light-emitting element layer 3 may include a plurality organic light-emitting elements of multiple colors. Each organic light-emitting element may include a first electrode 31, a light-emitting layer 32, and a second electrode 33. The light-emitting layer 32 may include a first common layer 321, a light-emitting material layer 323, and a second common layer 322. The first common layer 321 and the second common layer 322 may be both film layers formed by an evaporation process. For example, the film layers may be formed by the evaporation material through a common mask. The common mask may include common vapor deposition openings corresponding to organic light-emitting elements of various colors such that the portions of the first common layer 321 formed by the vapor deposition corresponding to the organic light-emitting elements may all be continuous.

In one embodiment, as shown in FIG. 1 and FIG. 3, the light-emitting element layer 3 may include a red organic light-emitting element 6, a green organic light-emitting element 7 and a blue organic light-emitting element 8. Because the first common layer 321 may be a continuous layer formed on the side of the first electrode 31 facing away from the substrate 1 by the evaporation process, for example, the portions of the first common layer 321 corresponding to the organic light-emitting elements of various colors may all be continuous. When some of the organic light-emitting elements emit light, especially when the organic light-emitting elements with a relatively high starting voltage emits light (for example, the blue organic light-emitting element 8), a lateral leakage may be likely to occur in the first common layer 321. After the lateral leakage is stored in the compensation capacitor C2 between adjacent organic light-emitting elements, the miss-lighting (or light leaking) of the organic light-emitting elements due to the lateral leakage may be avoided; and the crosstalk between adjacent organic light-emitting elements may be prevented.

Figure 4:
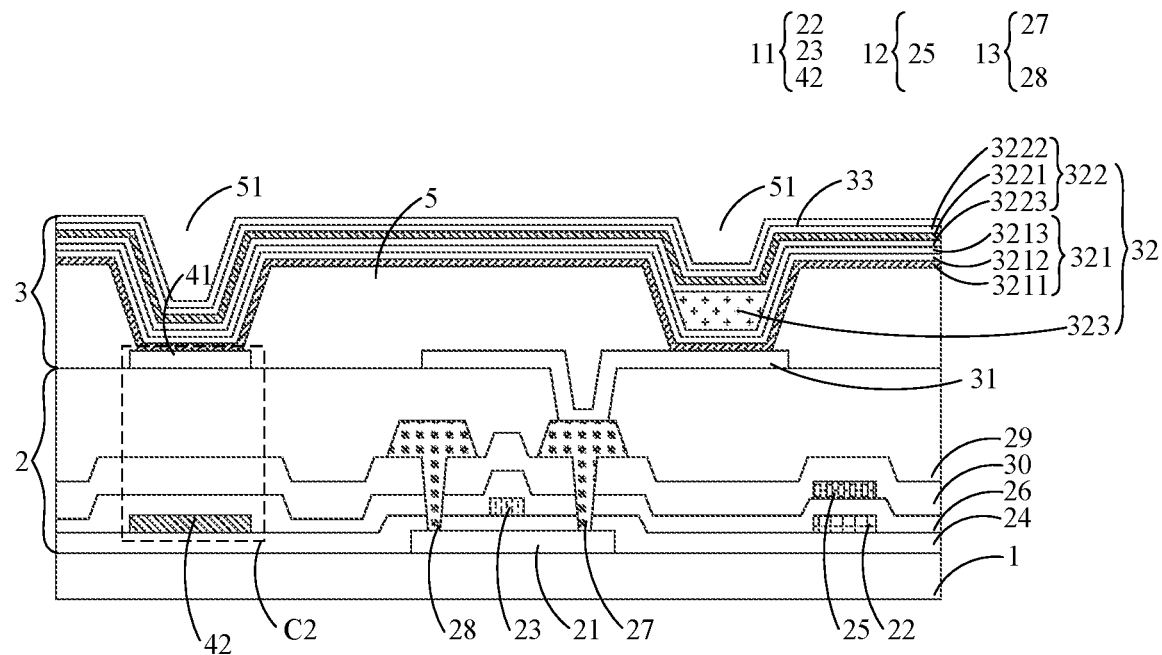
FIG. 4 illustrates a layer structure of another exemplary display panel according to various disclosed embodiments of the present disclosure.

FIG. 4 illustrates a layer structure of another exemplary display panel according to various disclosed embodiments of the present disclosure. As shown FIG. 4 and FIG. 1, in one embodiment, along the direction away from the substrate 1, the first common layer 321 may include at least a hole injection layer 3211 and a hole transport layer 3212. The first common layer 321 may also include an electron barrier layer 3213. The electron barrier layer 3213 may be disposed on the side of the hole transport layer 3212 away from the substrate 1. The second common layer 322 may include at least an electron transport layer 3221 and an electron injection layer 3222. The second common layer 322 may also include a hole barrier layer 3223 disposed on the side of the electron transport layer 3221 facing the substrate 1. Because the hole concentration in the hole injection layer 3223 may be relatively high, a lateral leakage may be prone to occur. The first electrode plate 41 in the compensation capacitor C2 may be in contact with the first common layer 321. For example, the first plate 41 may be in direct contact with the hole injection layer 3211 to lead the lateral leakage current in the hole injection layer 3211 to the compensation capacitor C2. Accordingly, the crosstalk between adjacent organic light-emitting elements may be prevented.

In one embodiment, the first electrode 31 may be an anode, and the second electrode 33 may be a cathode. The material of the first electrode 31 may be transparent indium tin oxide, etc., and the material of the second electrode 33 may be a metal material, etc.

In one embodiment, as shown in FIG. 1, the first plate 41 and the first electrode 31 may be disposed in the same layer, and the display panel may further include a pixel definition layer 5 formed on the side of the first electrode 31 away from the substrate 1. The first common layer 321 may be formed on the side of the pixel definition layer 5 away from the substrate 1.

The pixel definition layer 5 may include at least one first opening 51. Along a direction perpendicular to the plane where the substrate 1 is located, the first opening 51 and the first electrode 31 may at least partially overlap.

In the above embodiment, as shown in FIG. 1, the display panel may include the substrate 1, the driving circuit layer 2 formed on the substrate 1, the first electrode 31 and the first plate 41 formed on the driving circuit layer 2. The first electrode 31 and the first plate 41 may be disposed in the same layer and insulated from each other. The display panel may further include the pixel definition layer 5 formed on the side of the first electrode 31 and the first plate 41 away from the substrate 1. The pixel definition layer 5 may include a plurality of first openings 51 exposing the first electrode 31 and the first plate 41. The display panel may also include the first common layer 321 formed on the side of the pixel definition layer 5 away from the substrate 1. The first common layer 321 may include a portion formed on the pixel defining layer 5 and a portion falling into the first opening 51. The portion that falls into the first opening 51 may be in contact with the first electrode 31 or the first plate 41 in the first opening 51 such that the first common layer 321 may be in direct contact with the first plate 41. Accordingly, the lateral leakage current between the adjacent organic light-emitting elements may be stored in the compensation capacitor C2.

In one embodiment, referring to FIG. 1 and FIG. 4, along a direction away from the substrate 1, the driving circuit layer 2 may include an active layer 21, a first metal layer 11, a second metal layer 12, and a third metal layer 13 and, a first insulation layer 24 disposed between the active layer 21 and the first metal layer 11, a second insulation layer 26 disposed between the first metal layer 11 and the second metal layer 12, and a third insulation layer 30 disposed between the second metal layer 12 and the third metal layer 13 and a planarization layer 29 disposed between the third metal layer 13 and the light-emitting element layer 3.

Figure 5:
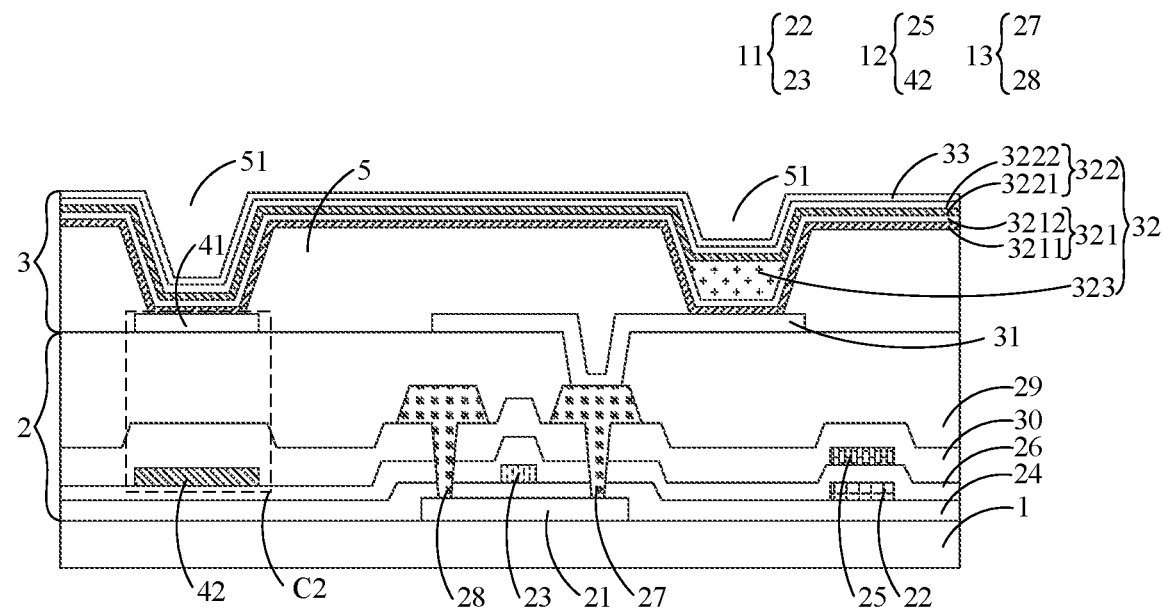
FIG. 5 illustrates a layer structure of another exemplary display panel according to various disclosed embodiments of the present disclosure.
Figure 6:
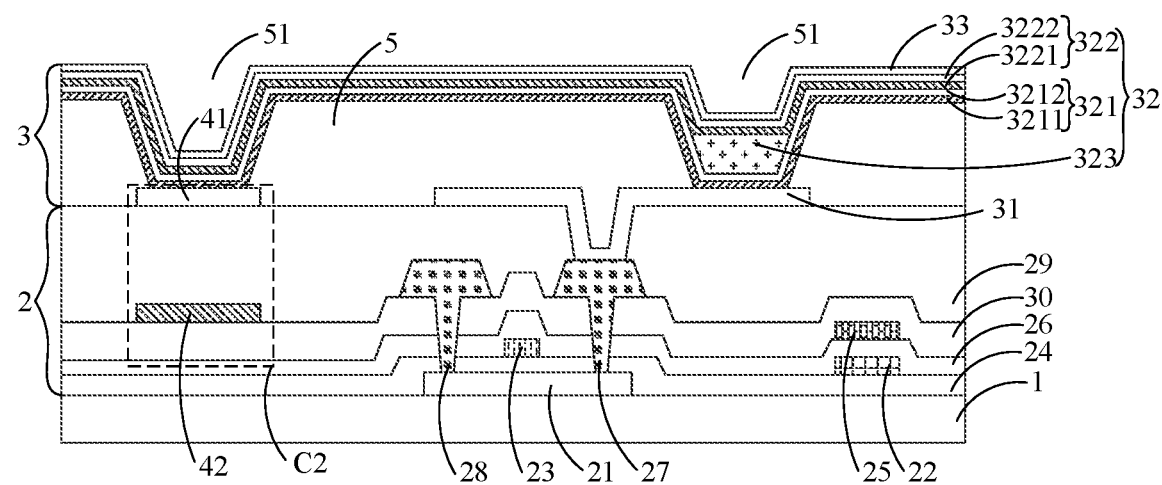
FIG. 6 illustrates a layer structure of another exemplary display panel according to various disclosed embodiments of the present disclosure.

As shown in FIG. 1 and FIG. 4, the driving circuit layer 2 of the display panel may include devices such as transistors and capacitors, etc. The gate electrode 23 of the transistor, the bottom plate 22 of the capacitor, etc., may be formed in the first metal layer 11. The top plate 25 of the capacitor may be formed in the second metal layer 12. The source electrode 27 and the drain electrode 28 of the transistor may be formed in the third metal layer 13. The second plate 42 of the compensation capacitor C2 may be disposed on at least one of the first metal layer 11, the second metal layer 12 and the third metal layers 13. FIG. 1 is a schematic structural view when the second plate 42 is formed on the first metal layer 11. FIG. 5 is schematic structural view when the second plate 42 is formed on the second metal layer 12. FIG. 6 is a schematic structural view when the second plate 42 is formed on the third metal layer 13. In the display panel provided by the present disclosure, all the second plates 42 may be disposed in the same layer, or different layers.

Figure 7:
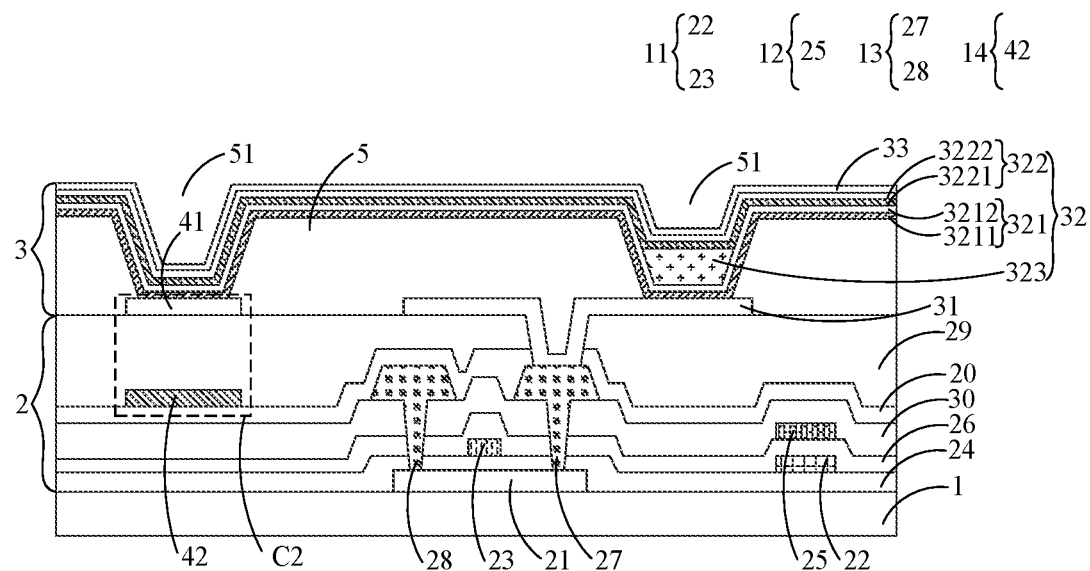
FIG. 7 illustrates a layer structure of another exemplary display panel according to various disclosed embodiments of the present disclosure.

FIG. 7 illustrates a layer structure of another exemplary display panel according to various disclosed embodiments of the present disclosure. As shown in FIG. 7, in one embodiment, the driving circuit layer 2 may further include a fourth insulation layer 20 disposed on the side of the third metal layer 13 away from the third insulation layer 30, and a fourth metal layer 14 disposed a second side of the fourth insulation layer 20 away from the third metal layer 13. At least a portion of the second plate 42 may be disposed on the fourth metal layer 14. When the second plate 42 is formed on the fourth metal layer 14, the distance between the first plate 41 and the second plate 42 of the compensation capacitor C2 may be relatively small. Accordingly, the capacitance may be relatively large, and the storage of the leakage current may be improved.

In some embodiments, the fourth metal layer 14 may be used to lay out the data signal line Data, the first power signal line PVDD, the second power signal line PVEE, the reset signal line Vref and other signal lines.

In the above embodiment, the materials of the first metal layer 11 and the second metal layer 12 may be metals, such as molybdenum, etc. Along the direction away from the substrate 1, the third metal layer 13 and the fourth metal layer 14 may both include a titanium layer, an aluminum layer, and a second titanium layer. In some embodiments, both the third metal layer 13 and the fourth metal layer 14 may include a molybdenum layer.

In one embodiment, the driving circuit layer 2 may include a plurality of driving circuits, and a driving circuit may be correspondingly connected with at least one organic light-emitting element. As shown in FIG. 2, the driving circuit may include a data writing module 300, a threshold compensation module 400, a light-emitting control module 500, a first reset module 100, a second reset module 600 and a driving module 200.

The first terminal of the first reset module 100 may be electrically connected to the first node N1, the second terminal of the first reset module 100 may be electrically connected to the reset signal line Vref, and the control terminal of the first reset module 100 may be electrically connected to the first scan signal line Scan1.

The control terminal of the driving module 200 may be electrically connected to the first node N1, the first terminal of the driving module 200 may be electrically connected to the second node N2, and the second terminal of the driving module 200 may be electrically connected to the third node N3.

The first terminal of the data writing module 300 may be electrically connected to the second node N2, the second terminal of the data writing module 300 may be electrically connected to the data signal line Data, and the control terminal of the data writing module 300 may be electrically connected to the second scan signal line Scan2.

The threshold compensation module 400 may include a first sub-module 401 and a second sub-module 402. The first terminal of the first sub-module 401 may be electrically connected to the first power signal line PVDD, and the second terminal of the first sub-module 401 may be electrically connected to the first node N1. The first terminal of the second sub-module 402 may be electrically connected to the first node N1, the second terminal of the second sub-module 402 may be electrically connected to the third node N3, and the control terminal of the second sub-module 402 may be electrically connected to the second scan signal line Scan2.

The light-emitting control module 500 may include a first light-emitting control sub-module 501 and a second light-emitting control sub-module 502. The first terminal of the first light-emitting control sub-module 501 may be electrically connected to the first power signal line PVDD. The second terminal of the first light-emitting control sub-module 501 may be electrically connected to the second node N2, and the control terminal of the first light-emitting control sub-module 501 may be electrically connected to the light-emitting control signal line Emit. The first terminal of the second light-emitting control sub-module 502 may be electrically connected to the third node N3, and the first terminal of the second light-emitting control sub-module 502 may be electrically connected to the third node N3. The second terminal of the first light-emission control sub-module 501 may be electrically connected to the fourth node N4, and the control terminal of the first light-emitting control sub-module 501 may be electrically connected to the light-emitting control signal line Emit.

The first terminal of the second reset module 600 may be electrically connected to the fourth node N4, the second terminal of the second reset module 600 may be electrically connected to the reset signal line Vref, and the control terminal of the second reset module 600 may be electrically connected to the first scan line Scan1.

The first electrode 31 of the organic light-emitting element may be electrically connected to the fourth node N4.

Figure 8:
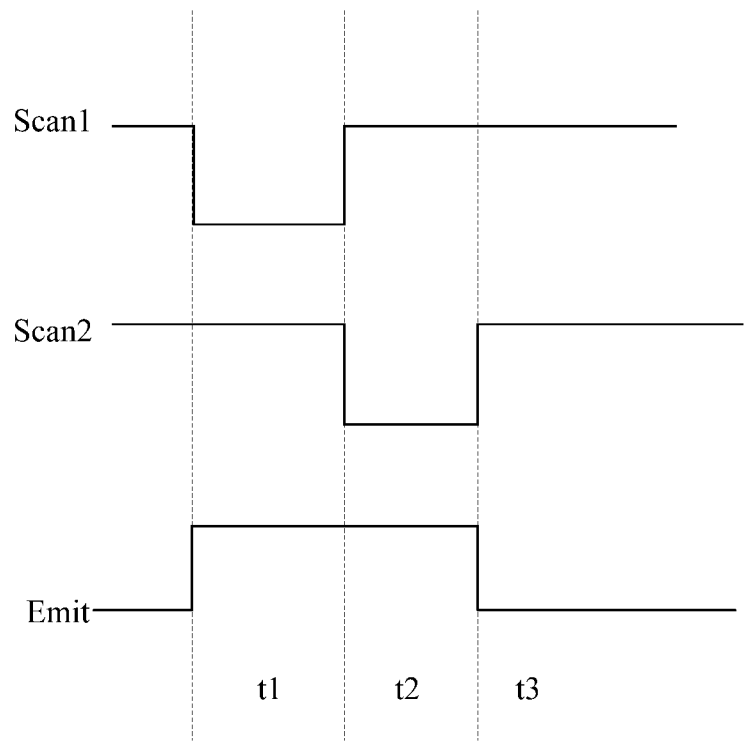
FIG. 8 illustrates another exemplary driving circuit according to various disclosed embodiments of the present disclosure.

FIG. 8 illustrates an exemplary sequence diagram of a driving circuit according to various disclosed embodiments of the present disclosure. As shown in FIG. 8, the process for driving the organic light-emitting element to emit light by the driving circuit provided by the embodiment of the present disclosure may include an initialization stage t1, a data writing stage t2, and a light-emitting stage t3. The first scan signal line Scan1 may be configured to output a first scan signal, the second scan signal line Scan2 may be configured to output a second scan signal, the first power signal line PVDD may be configured to provide a first voltage signal, and the second power signal line PVEE may be configured to provide a second voltage signal, the data signal line Data may be configured to provide a data signal, the reset signal line Vref may be configured to output a reset signal, and the light-emitting control signal line Emit may be configured to output a light-emitting control signal.

Referring to the sequence diagram shown in FIG. 8, the condition that the first scan signal line Scan1 may provide an active low-level signal at stage t1, the second scan signal line Scan2 may provide an active low-level signal at the stage t2, and light-emitting control signal line Emit may provide an active low-level signal at the stage t3 is used as an example.

In the initialization stage t1, the first reset module 100 may reset the first node N1, and the second reset module 600 may reset the first electrode 31 of the organic light-emitting element.

In the data writing stage t2, the data writing module 300 may provide a data signal to the second node N2, and the driving module 200 may be operated to provide the voltage signal of the second node N2 to the third node N3. In this stage, under the control of the second scan signal line Scan2, the second sub-module 402 of the threshold compensation module 400 may provide the voltage signal of the third node N3 to the first node N1 to complete the threshold compensation.

In the light-emitting stage t3, under the control of the light-emitting control signal line Emit, the first light-emitting control sub-module 501 may provide the first voltage signal of the first voltage signal line PVDD to the second node N2, and the driving module 200 may maintain the conduction for a certain period of time until it is off for a disconnection. In this stage, the driving module 200 may provide the voltage signal of the second node N2 to the third node N3, and the second light-emitting control sub-module 502 may transmit the voltage signal of the third node N3 and, under the control of the light-emitting control signal line Emit, the second light-emitting sub-module 502 may provide the voltage signal of the third node N3 to the fourth node N4 such that the organic light-emitting element may emit light when the voltage signal of the fourth node N4 charges the first electrode 31 of the organic light-emitting element to reach the turn-on voltage.

In the above-mentioned light-emitting stage t3, the leakage current existing in the first common layer 321 may be led out into the compensation capacitor C2 through the first plate 41 of the compensation capacitor C2 arranged between the adjacent organic light-emitting elements to avoid a crosstalk occurs between adjacent organic light-emitting elements.

The first plate 41 of the compensation capacitor C2 may be connected to the reset signal line Vref such that the reset signal may be used to reset the compensation capacitor C2 to ensure the leakage current storage effect of the compensation capacitor C2 after a long-term use.

In the display panel provided by the embodiment of the present disclosure, the driving circuit layer 2 may include a driving circuit corresponding to each organic light-emitting element in a one-to-one correspondence, or each driving circuit may drive a plurality of organic light-emitting elements of the same color.

Figure 9:
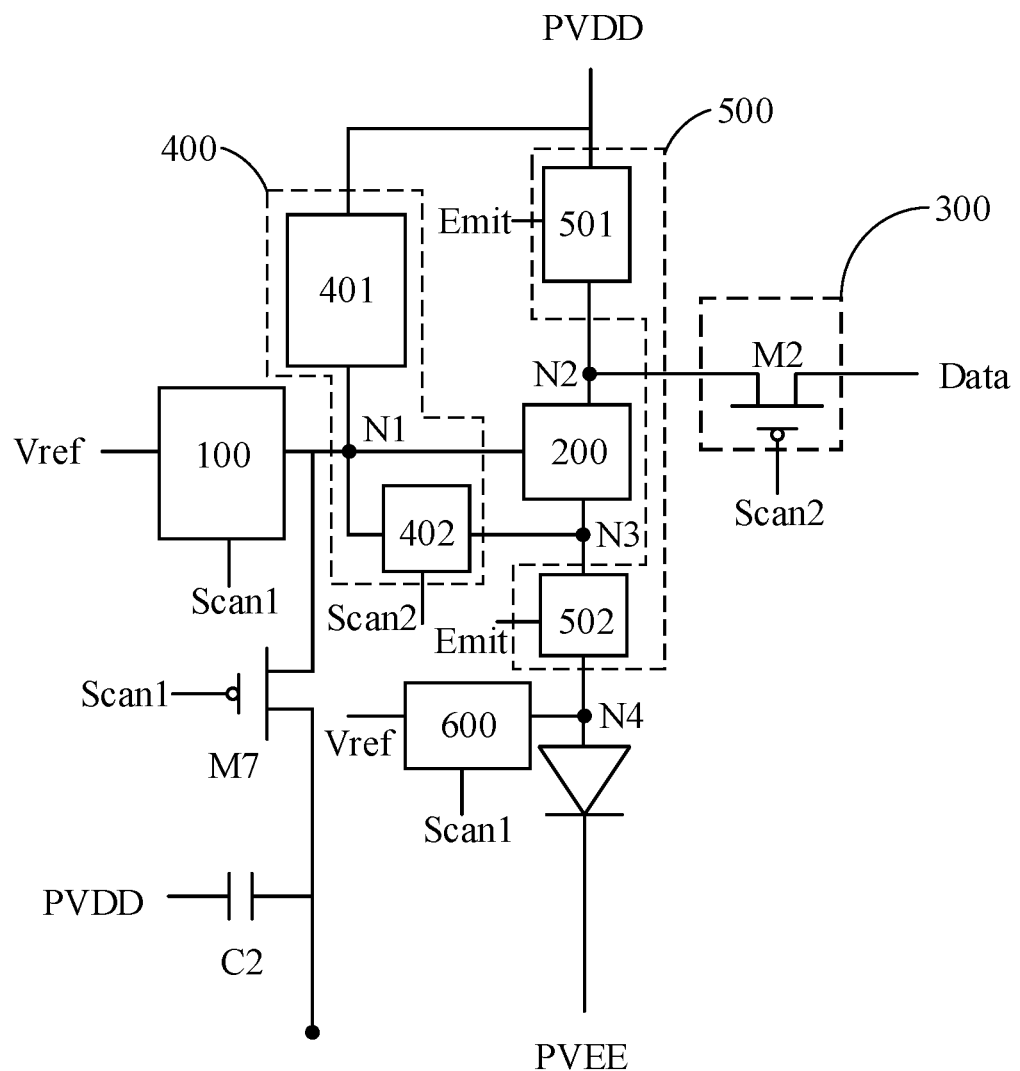
FIG. 9 illustrates an exemplary data writing module according to various disclosed embodiments of the present disclosure.

FIG. 9 illustrates an exemplary data writing module according to one embodiment of the present disclosure. As shown in FIG. 9, in one embodiment, the data writing module 300 may include a second transistor M2. The gate electrode of the second transistor M2 may be electrically connected to the second scan signal line Scan2, and the first terminal of the first transistor M2 may be electrically connected to the data signal line Data.

Figure 10:
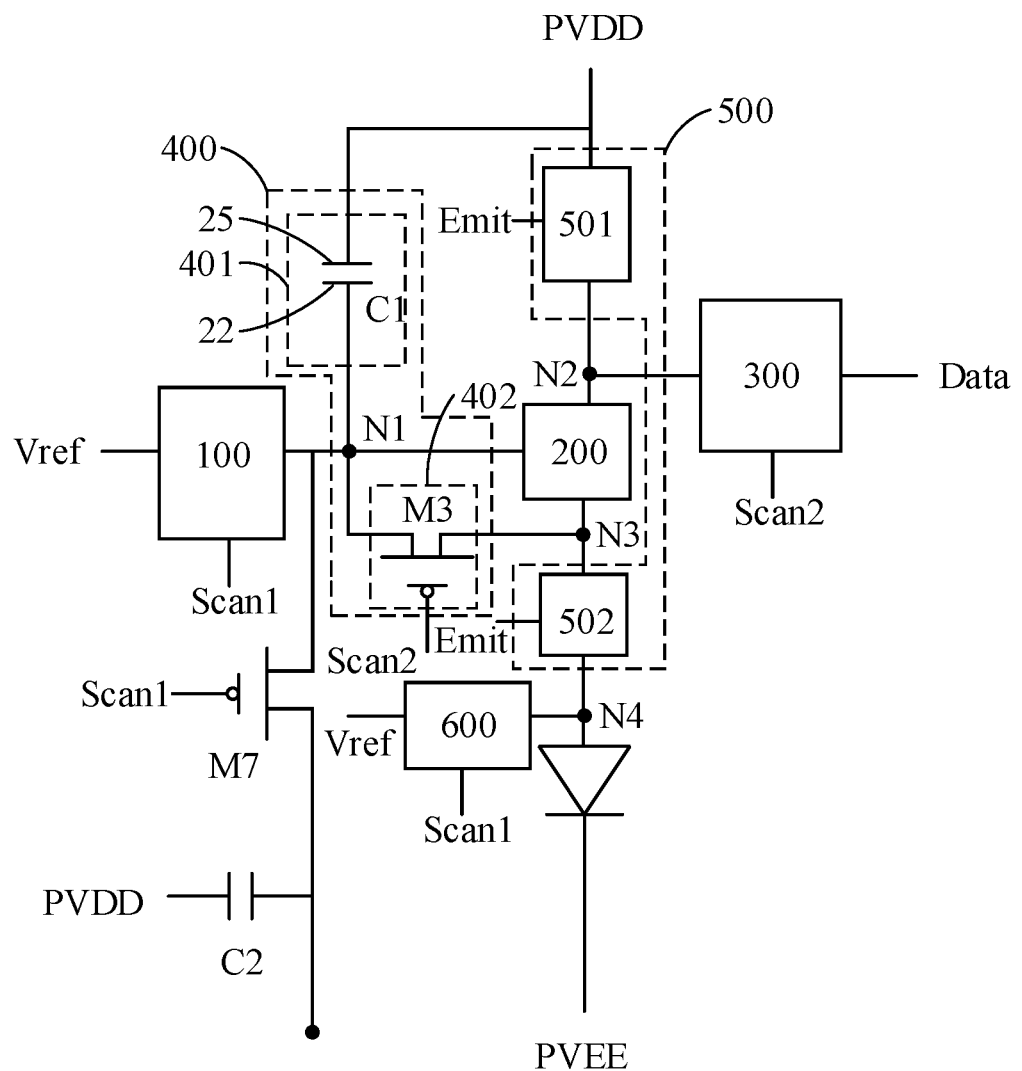
FIG. 10 illustrates an exemplary threshold compensation module according to various disclosed embodiments of the present disclosure.

FIG. 10 illustrates an exemplary threshold compensation module according to one embodiment of the present disclosure. As shown in FIG. 10, in one embodiment, the first sub-module 401 in the threshold compensation module 400 may include a storage capacitor C1. The storage capacitor may include a top plate 25 and a bottom plate 22. The second sub-module 402 may include a third transistor M3.

The gate electrode of the third transistor M3 may be electrically connected to the second scan signal line Scan2, the first terminal of the third transistor M3 may be electrically connected to the first node N1, and the second terminal of the third transistor M3 may be electrically connected to the third node N3.

The top plate 25 of the storage capacitor C1 may be electrically connected to the first power signal line PVDD, and the bottom plate 22 of the storage capacitor C1 may be electrically connected to the first node N1.

Figure 11:
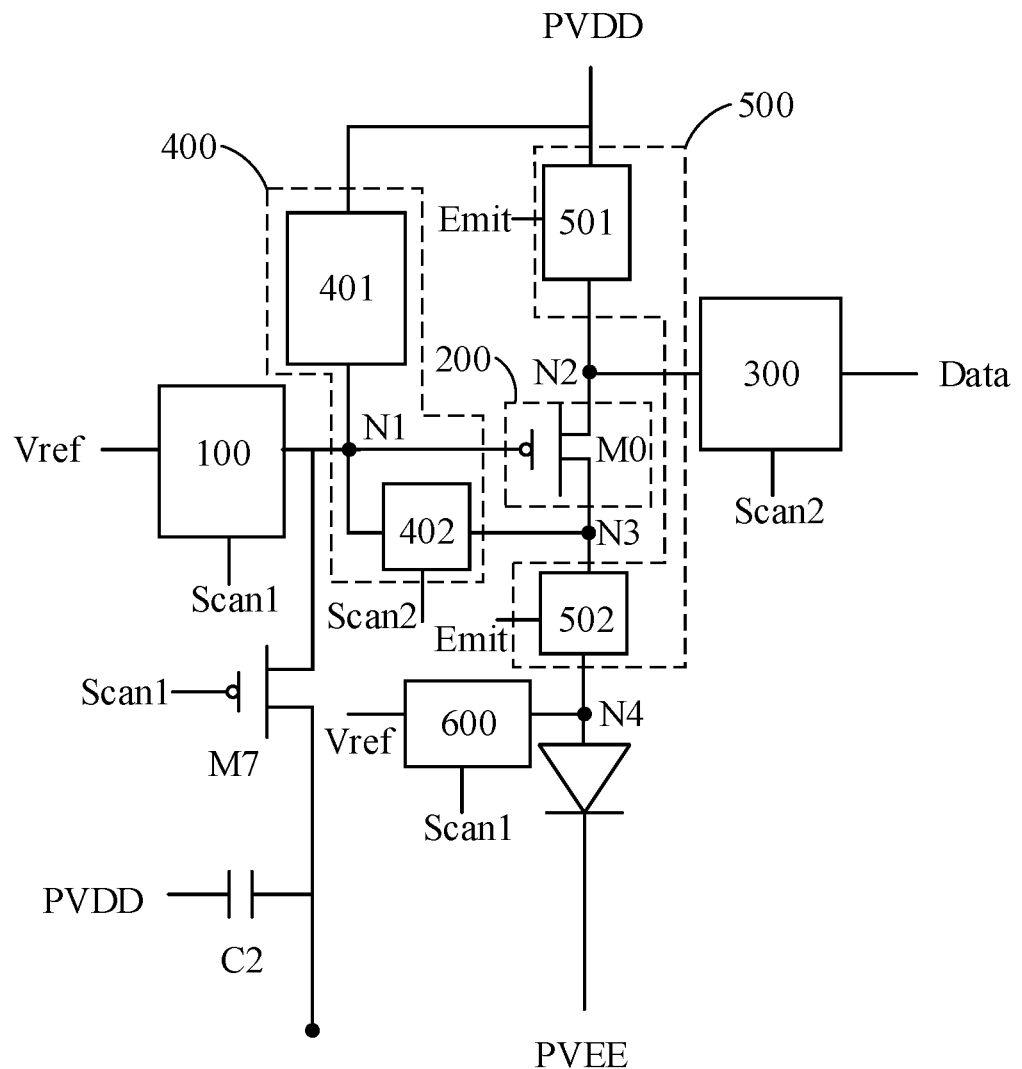
FIG. 11 illustrates an exemplary driving module according to various disclosed embodiments of the present disclosure.

FIG. 11 illustrates an exemplary driving module 200 according to one embodiment of the present disclosure. As shown in FIG. 11, the driving module 200 may include a driving transistor M0. The gate electrode of the driving transistor M0 may be the control terminal of the driving module 200, and the first terminal of the driving transistor M0 may drive the first terminal of the driving module 200. The second terminal of the driving transistor M0 may be the second terminal of the driving module 200.

In the data writing stage t2, as shown in FIGS. 9-11, under the configuration that the data writing module 300 includes the second transistor M2, the first sub-module 401 of the threshold compensation module 400 includes the storage capacitor C1, the second sub-module 402 includes the third transistor M3 and the driving module 200 includes the driving transistor M0, when the second scan signal provided by the second scan signal line Scan2 is a low-level signal, the second transistor M2 may be turned on for an conduction, and the data signal provided by the data signal line Data may be transmitted to the second node N2 through the second transistor M2, and the driving transistor M0 may be operated to provide the voltage signal of the second node N2 to the third node N3. In this stage, under the control of the second scan signal line Scan 2, the second sub-module 402 in the threshold compensation module 400 may provide the voltage signal of the third node N3 to the first node N1 to complete the threshold compensation.

In another embodiment, the second sub-module 402 in the threshold compensation module 400 may include a third transistor M3, and may also include two sub-transistors. It is understood that each transistor in the present disclosure may be substituted with two sub-transistors (double-gate transistor). For example, the source electrode of one sub-transistor may be connected to the drain electrode of the other sub-transistor, and the control terminals of the two sub-transistors may be connected to a same scan signal line. When two sub-transistors connected to each other are used instead of one transistor, the influence of the leakage current on the potential of the first node N1 may be further reduced, and the display effect of the display panel may be further improved.

Figure 12:
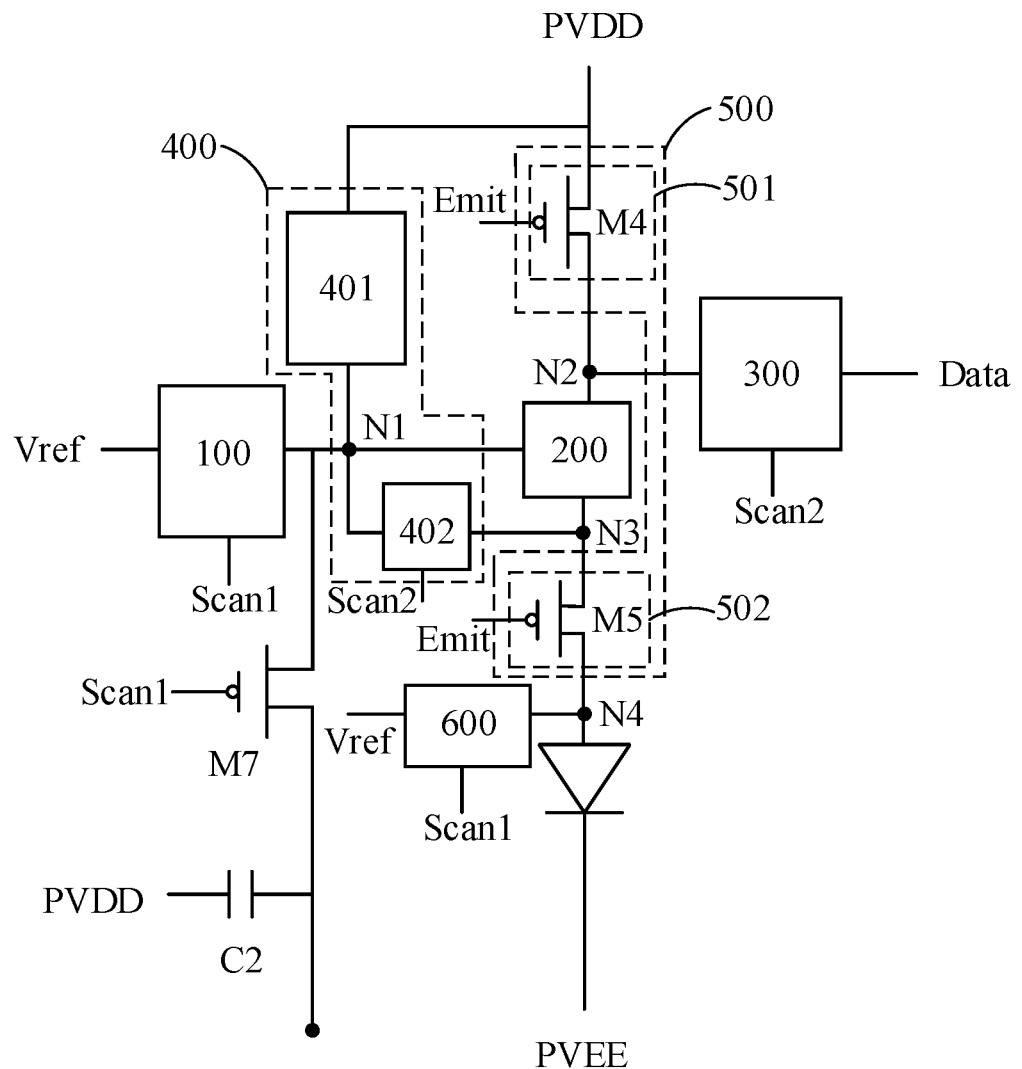
FIG. 12 illustrates an exemplary light-emitting control module according to various disclosed embodiments of the present disclosure.

FIG. 12 illustrates an exemplary light-emitting control module according to various disclosed embodiments of the present disclosure. As shown in FIG. 12, the light-emitting control module 500 may include a first light-emitting control sub-module 501 and a second light-emitting control sub-module 502. The first light-emitting control sub-module 501 may include a fourth transistor M4. The second light-emitting control sub-module 502 may include a fifth transistor M5.

The gate of the fourth transistor M4 may be electrically connected to the light-emitting control signal line Emit. The first terminal of the fourth transistor M4 may be electrically connected to the first power signal line PVDD, and the second terminal of the fourth transistor M4 may electrically connected to the second node N2.

The gate electrode of the fifth transistor M5 may be electrically connected to the light-emitting control signal line Emit. The first terminal of the fifth transistor M5 may be electrically connected to the third node N3, and the second terminal of the fifth transistor M5 may be electrically connected to the fourth node N4.

In the light-emitting stage t3, as shown in FIG. 12, when the light-emitting control signal provided by the light-emission control signal line Emit is at a low-level, the fourth transistor M4 may be turned on for a conduction under the control of the light-emitting control signal line Emit to provide the first voltage signal of the first voltage signal line PVDD to the second node N2, and the driving module 200 may maintain at a conduction for a certain period of time until it is turned off. In this stage, the driving module 200 may provide the voltage signal of the second node N2 to the third node N3. The fifth transistor M5 may be turned on under the control of the light-emitting control signal line Emit, and provide the voltage signal of the third node N3 to the fourth node N4 such that the organic light-emitting element may emit light when the voltage signal of the fourth node N4 charges the first electrode 31 of the organic light-emitting element to reach the turn-on voltage of the light-emitting element.

The first reset module 100 in the present disclosure may have various structures; and two possible implementation manners are described below.

Figure 13:
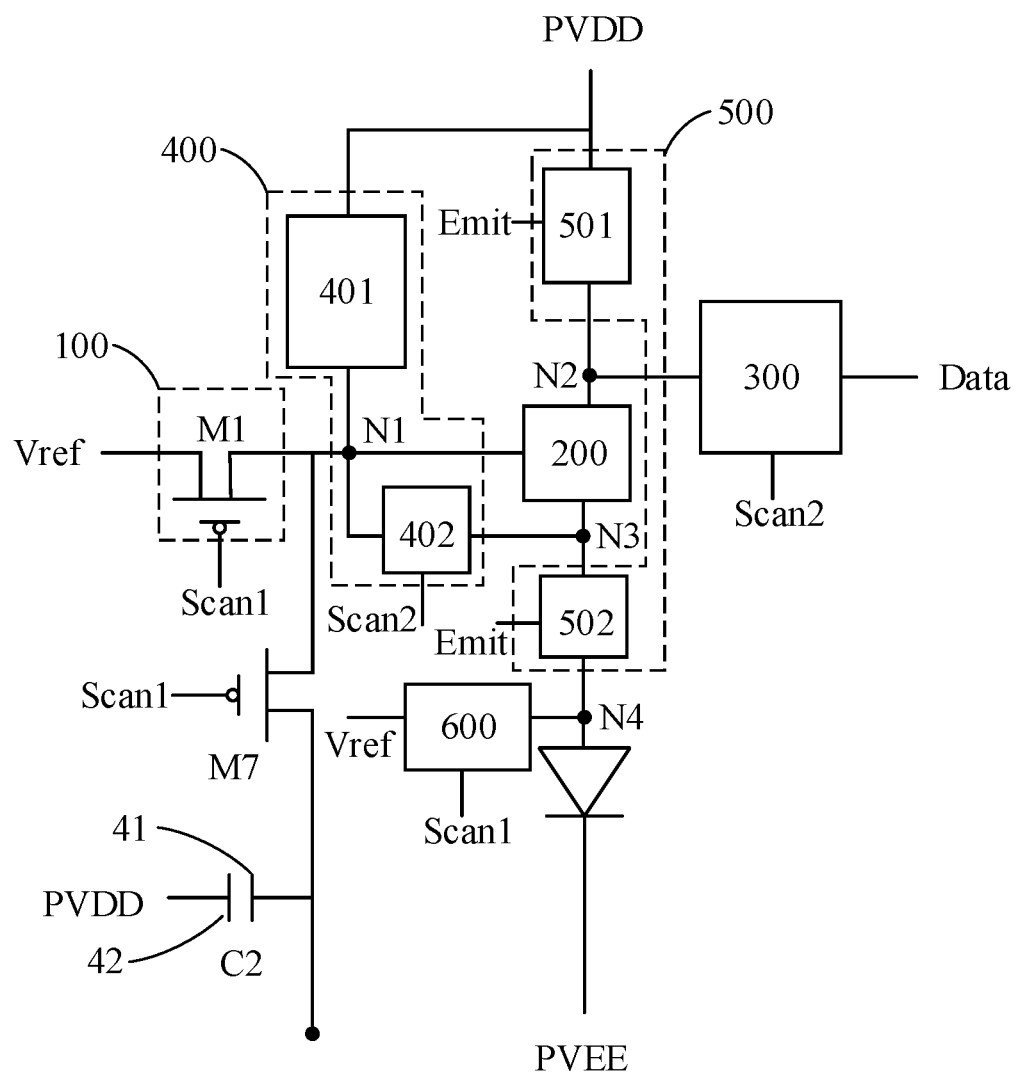
FIG. 13 illustrates an exemplary reset module according to various disclosed embodiments of the present disclosure.

In one embodiment, as shown in FIG. 13, the first reset module 100 may include a first transistor M1. The gate electrode of the first transistor M1 may be electrically connected to the first scan signal line Scan1, the first terminal of the first transistor M1 may be connected to the first node N1, and the second terminal of the first transistor M1 may be electrically connected to the reset signal line Vref.

In the above embodiment, in the initialization stage t1, the first reset module 100 may reset the first node N1. For example, when the first scan signal output by the first scan signal line Scan1 is at a low-level, the first transistor M1 may be turned on; the reset signal output by the reset signal line Vref may be transmitted from the second terminal of the first transistor M1 to the first terminal and then may reach the first node N1; and the resetting of the first node N1 may be completed.

Figure 14:
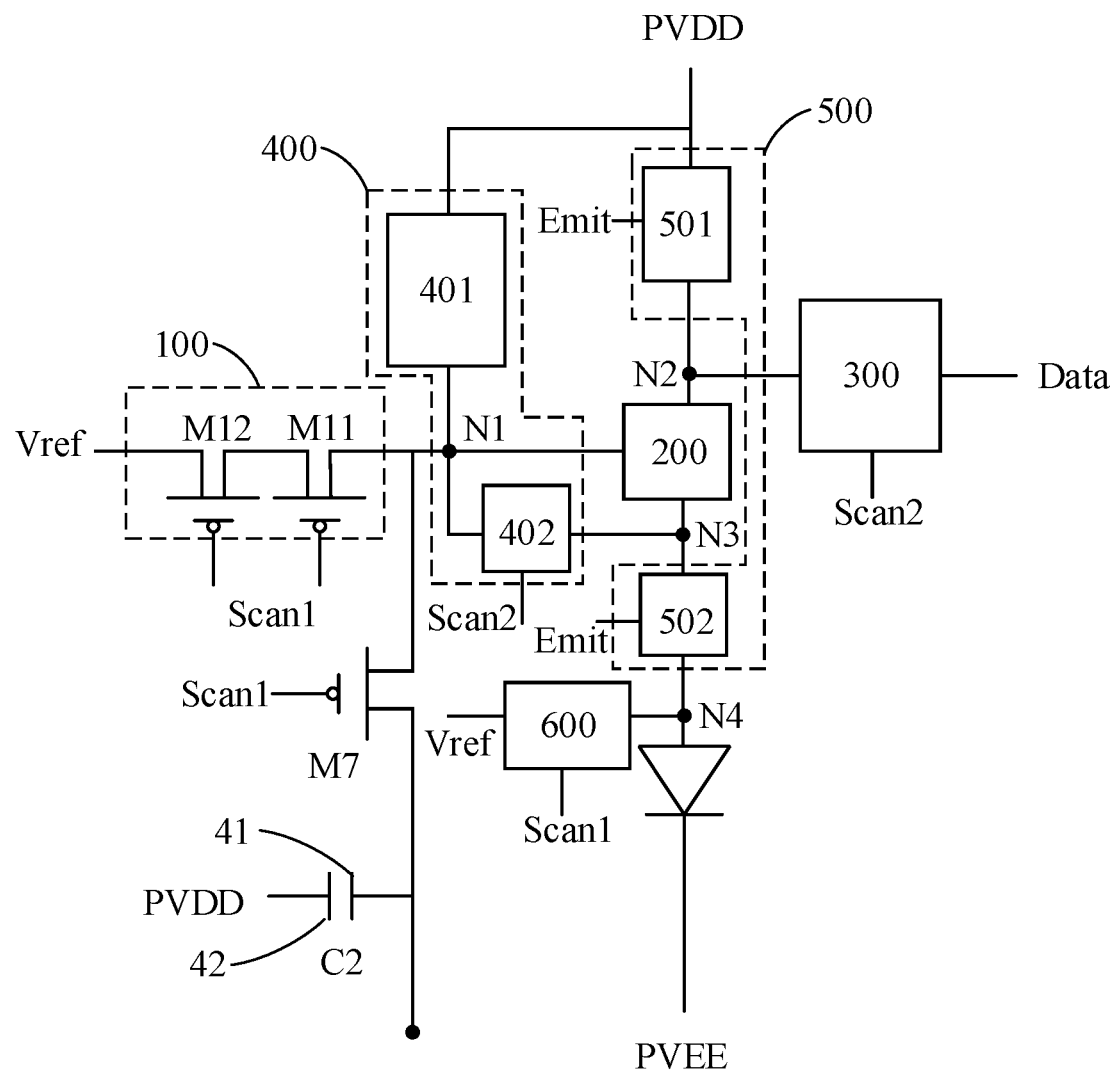
FIG. 14 illustrates another exemplary reset module according to various disclosed embodiments of the present disclosure.

In another embodiment, as shown in FIG. 14, the first reset module 100 may include a first transistor, and the first transistor may include a first sub-transistor M11 and a second sub-transistor M12. The second terminal of the first sub-transistor M11 may be electrically connected to the first terminal of the second sub-transistor M12; the gate electrode of the first sub-transistor M11 and the gate electrode of the second sub-transistor M12 may be both electrically connected to the first scan signal line Scan1. The first terminal of the first sub-transistor M11 may be electrically connected to the first node N1, and the second terminal of the second transistor M12 may be electrically connected to the reset signal line Vref.

In the above embodiment, in the initialization stage t1, the first reset module 100 may reset the first node N1. For example, when the first scan signal output by the first scan signal line Scan1 is at a low-level, the first sub-transistor M11 and the second sub-transistor M12 may all be turned on, and the reset signal output by the reset signal line Vref may be transmitted from the second terminal of the second sub-transistor M12 to the first terminal of the first sub-transistor M11 and then may reach the first node N1. Accordingly, the reset of the first node N1 may be completed.

Figure 15:
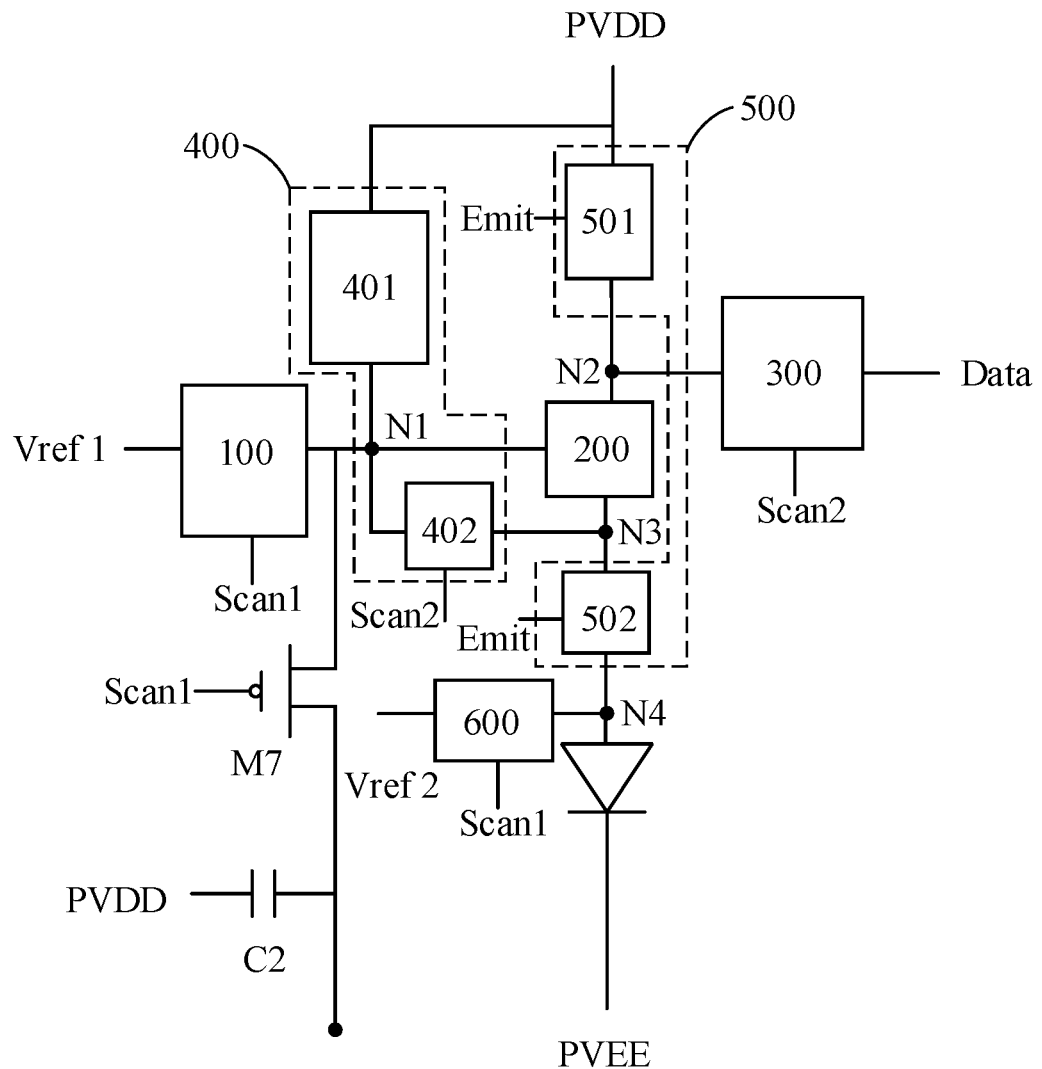
FIG. 15 illustrates an exemplary connection structure of the reset signal line according to various disclosed embodiments of the present disclosure.

The driving circuit layer 2 provided in the present disclosure may include the first reset signal line Vref1 or may further include the second reset signal line Vref2. When the driving circuit layer 2 only includes the first reset signal line Vref1, the reset signal lines connected to first reset module 100 and the second reset module 600 may be both the first reset signal line Vref1. When the driving circuit layer 2 includes the first reset signal line Vref1 and the second reset signal line Vref2, a feasible implementation manner may be that, as shown in FIG. 15, the reset signal line connected to the first reset module 100 may be the first reset signal line Vref1, and the reset signal line connected to the second reset module 600 may be the second reset signal line Vref2. The first reset signal line Vref1 may be used to output the first reset signal, and the second reset signal line Vref2 may be used to output the second reset signal. The voltages of the first reset signal and the second reset signal may be not equal. When the voltages are all negative values, the voltage of the first reset signal may be greater than the voltage of the second reset signal such that the first node N1 may quickly complete the threshold capture and the data writing. Such a configuration may be beneficial to realize the high frequency display of the display panel.

In a feasible implementation, the first plate 41 of the compensation capacitor C2 may be connected to the first reset module 100 to realize the electrical connection between the first plate 41 of the compensation capacitor C2 and the reset signal line Vref, and to realize the connection between the first plate 41 of the compensation capacitor C2 and the reset signal line Vref. The specific implementation of the reset of the compensation capacitor C2 may be as following.

As shown in FIG. 13, when the first reset module 100 includes the first transistor M1, at least one driving circuit may further include a control transistor M7. The gate electrode of the control transistor M7 may be electrically connected to the first scan signal line Scan1; and the first terminal of the control transistor M7 may be electrically connected to the first terminal of the first transistor M1; and the second terminal of the control transistor M7 may be electrically connected to the first plate 41 of the compensation capacitor C2.

As shown in FIG. 14, when the first reset module 100 includes the first transistor, and the first transistor includes the first sub-transistor M11 and the second sub-transistor M12, at least one driving circuit may further include the control transistor M7. The gate electrode of the control transistor M7 may be electrically connected to the first scan signal line Scan1; the first terminal of the control transistor M7 may be electrically connected to the first terminal of the first sub-transistor M11; and the second terminal of the control transistor M7 may be electrically connected to the first plate of the compensation capacitor C2.

Figure 16:
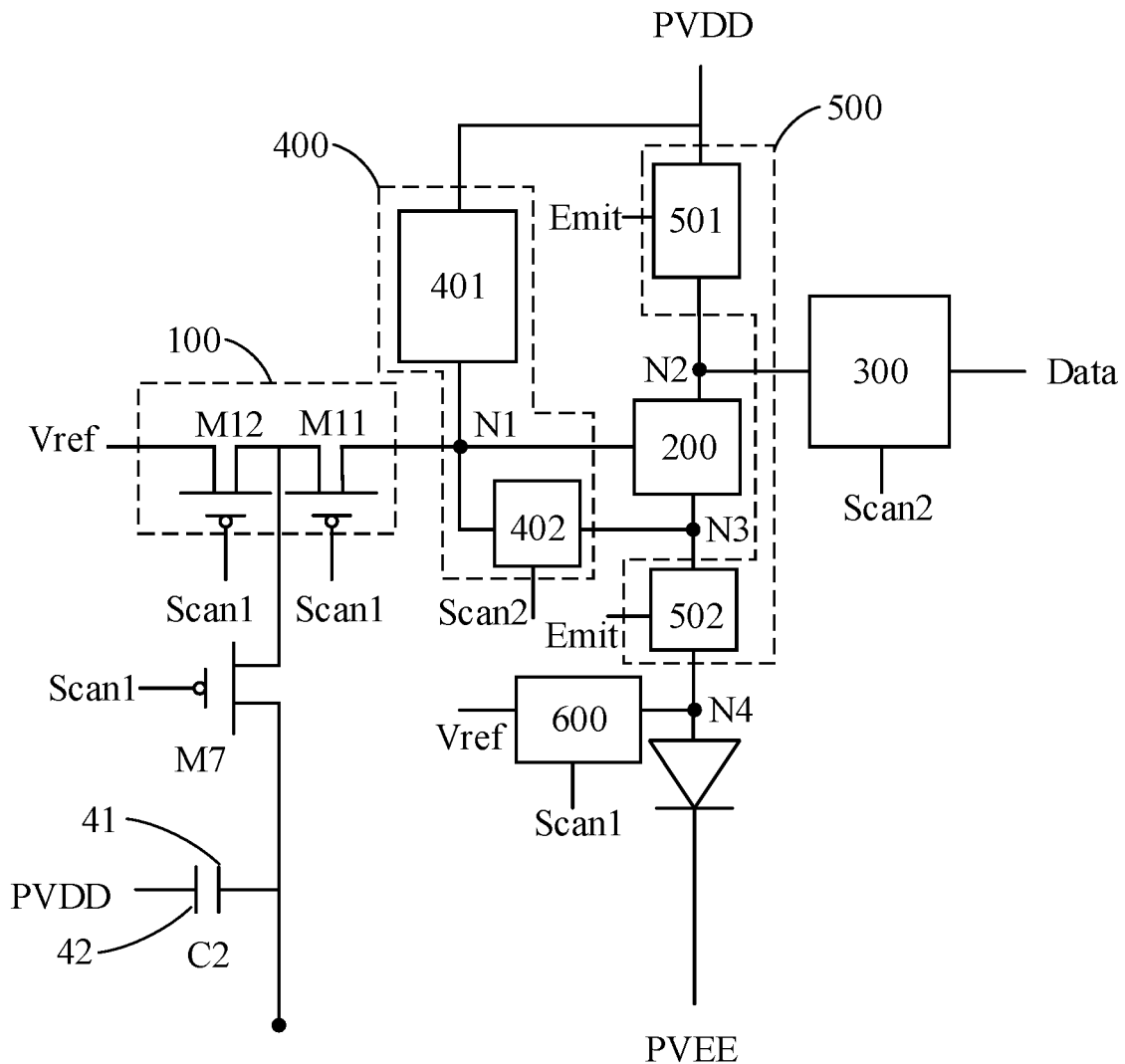
FIG. 16 illustrates an exemplary compensation capacitor under a first connection manner according to various disclosed embodiments of the present disclosure.

In another embodiment, as shown in FIG. 16, the gate electrode of the control transistor M7 may be electrically connected to the first scan signal line Scan1; the first terminal of the control transistor M7 may be electrically connected to the second terminal of the first sub-transistor M11 and the first terminal of the second sub-transistor M12; and the second terminal of the control transistor M7 may be electrically connected to the first plate 41 of the compensation capacitor C2.

Figure 17:
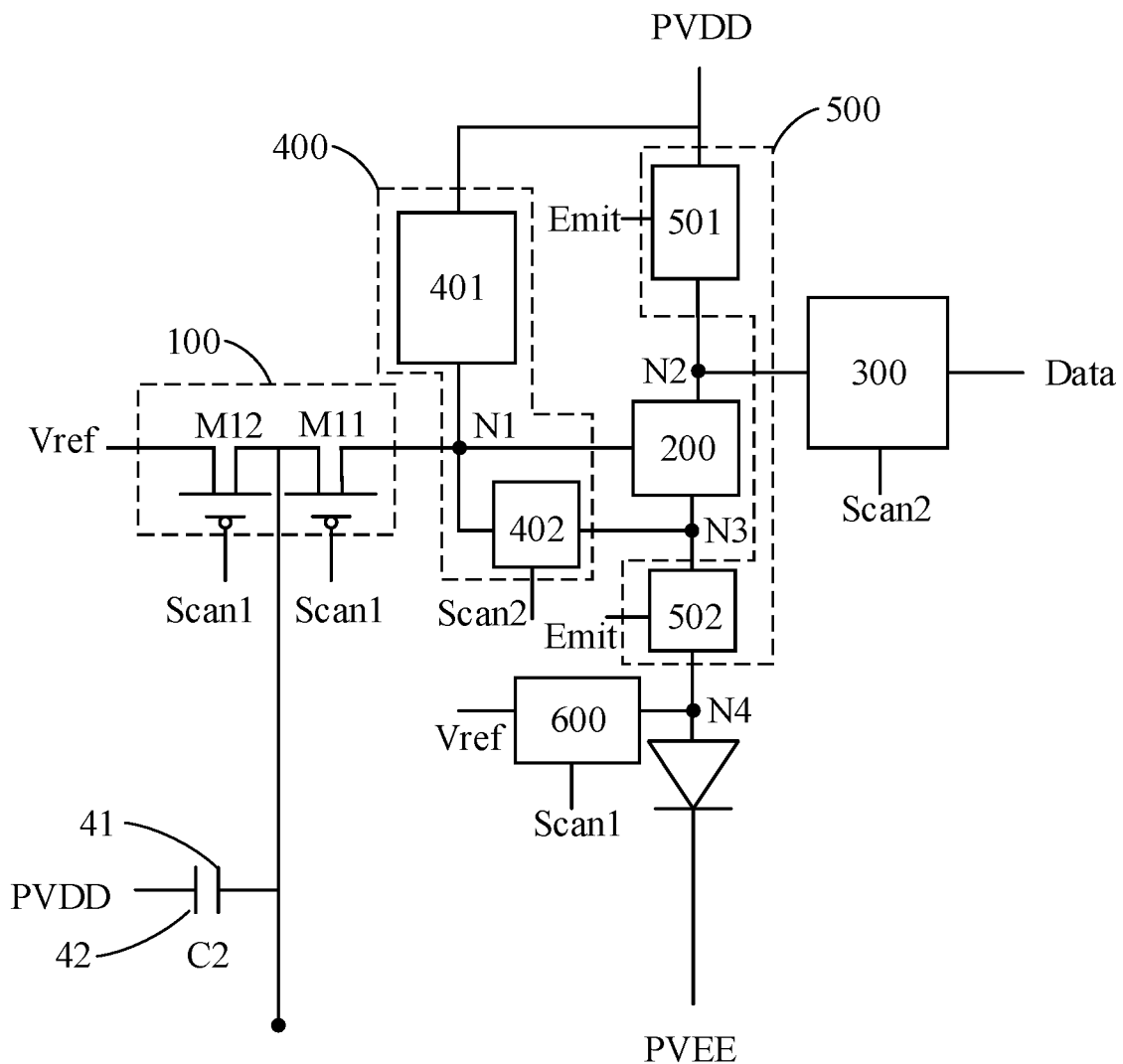
FIG. 17 illustrates an exemplary compensation capacitor under a second connection manner according to various disclosed embodiments of the present disclosure.

Further, as shown in FIG. 17, when the first reset module 100 includes the first transistor, and the first transistor includes the first sub-transistor M11 and the second sub-transistor M12, the first plate 41 of the compensation capacitor C2 may be electrically connected to the second terminal of the first sub-transistor M11. The above-mentioned connection mode may multiplex the second sub-transistor M12 in the first reset module 100 to control the on/off of the signal between the first plate 41 of the compensation capacitor C2 and the reset signal line Vref, the layout of various modules in the driving circuit layer may not be affected. Thus, the yield of the circuit after including the compensation capacitor C2 may be ensured.

In the above embodiment, the compensation capacitor C2 may be electrically connected to the first reset module 100, and both the compensation capacitor C2 and the first reset module 100 may be controlled by the first scan signal line Scan1. Thus, the compensation capacitor C2 may be reset when the first reset module 100 is in operation to reset the compensation capacitor C2 while the first reset module 100 performs the reset operation. For example, the leakage current stored in the compensation capacitor C2 may be released to ensure the storage effect of the compensation capacitor C2 on the leakage current after a long-term use. The second reset module 600 in the present disclosure may have various structures, two possible implementation manners are listed below.

Figure 18:
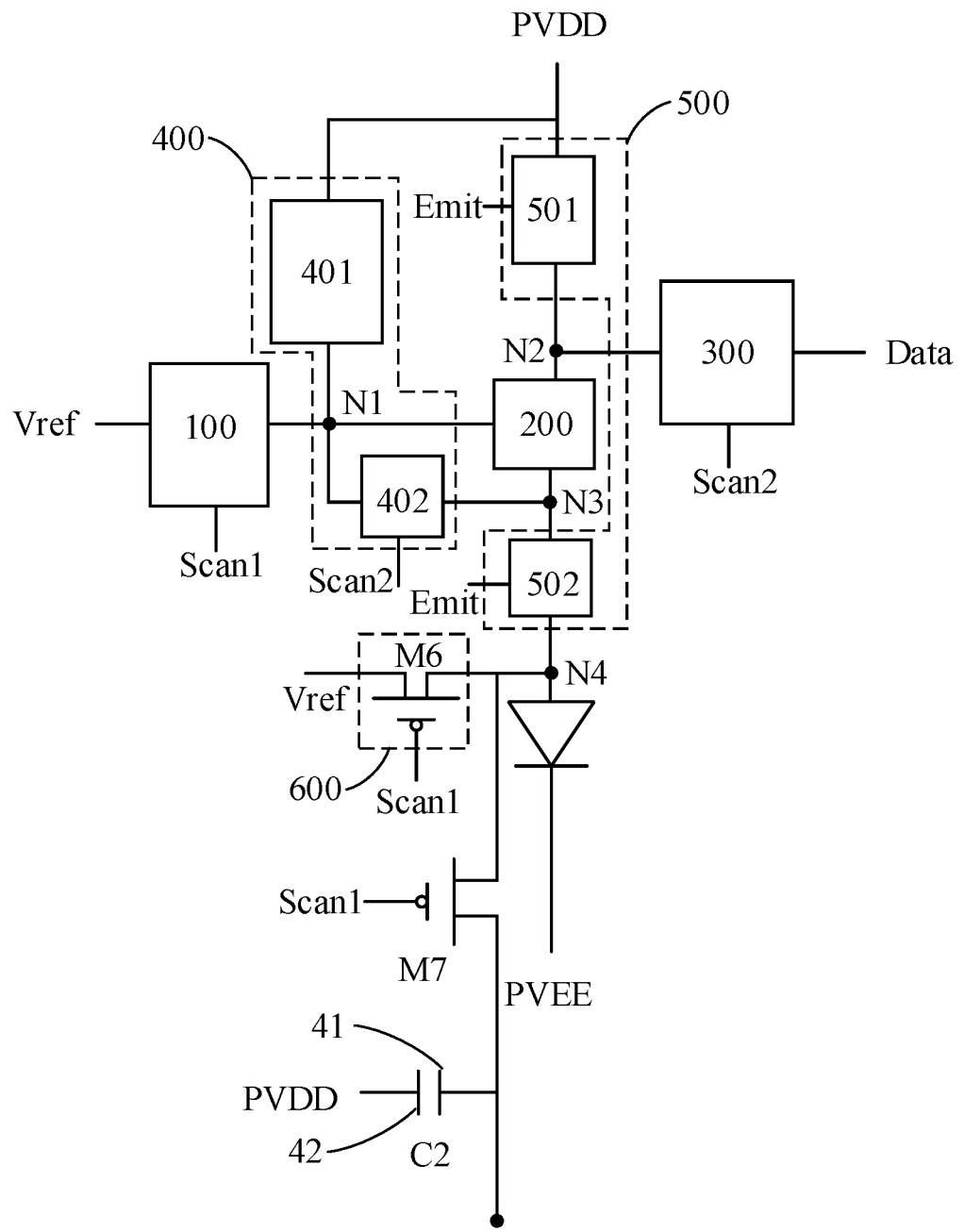
FIG. 18 illustrates an exemplary compensation capacitor under a third connection manner according to various disclosed embodiments of the present disclosure.

One possible implementation may be that, as shown in FIG. 18, the second reset module 600 may include a sixth transistor M6, and the gate electrode of the sixth transistor M6 may be electrically connected to the first scan signal line Scan1 (or the second scan signal line Scan2). The first terminal of the sixth transistor M6 may be electrically connected to the fourth node N4; and the second terminal of the sixth transistor M6 may be electrically connected to the reset signal line Vref.

In the above embodiment, in the initialization stage t1, the second reset module 600 may reset the first electrode 31 of the organic light-emitting element. For example, when the scan signal output by the first scan signal line Scan1 (or the second scan signal line Scan2) output (or the second scan signal) is at low level, the sixth transistor M6 may be turned on, and the reset signal output by the reset signal line Vref may be transmitted to the first terminal of the sixth transistor M6 through the second terminal of the sixth transistor M6, and then may reach the four node N4, i.e., reach the first electrode 31 of the organic light-emitting element. Thus, the resetting of the first electrode 31 of the organic light-emitting element may be completed.

Figure 19:
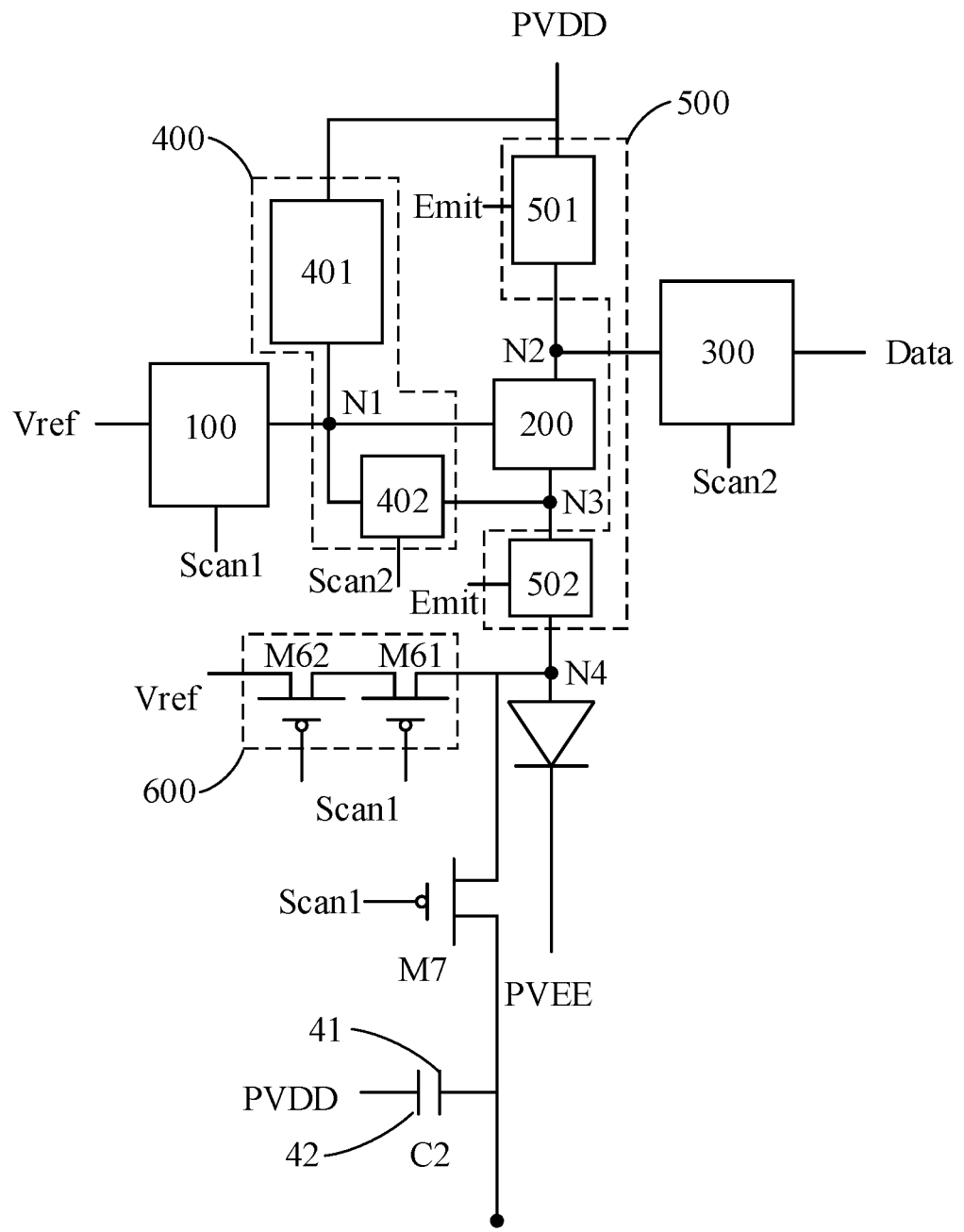
FIG. 19 illustrates an exemplary compensation capacitor under a fourth connection manner according to various disclosed embodiments of the present disclosure.

Another feasible implementation is that, as shown in FIG. 19, the second reset module 600 may include a sixth transistor, and the sixth transistor may include a third sub-transistor M61 and a fourth sub-transistor M62. The second terminal of the third sub-transistor M61 may be electrically connected to the first terminal of the fourth sub-transistor M62, the gate electrode of the third sub-transistor M61 and the gate electrode of the fourth sub-transistor M62 may be both connected to the second reset module with the same control signal line (the first scan signal line Scan1 or the second scan signal line Scan2), the first terminal of the third sub-transistor M61 may be electrically connected to the fourth node N4, and the second terminal of the fourth sub-transistor M62 may be electrically connected to the reset signal line Vref.

In the above embodiment, in the initialization stage t1, the second reset module 600 may reset the first terminal 31 of the organic light-emitting element. For example, when the first scan signal (or the second scan signal) output by the first scan signal line Scan1 (or the second scan signal line Scan2) is at a low-level, the third sub-transistor M61 and the fourth sub-transistor M62 may be both turned on, and the reset signal output by the reset signal line Vref may be transmitted to the first terminal of the three sub-transistor M61 through the second terminal of the fourth sub-transistor M62 and may reach the fourth node N4, i.e., reach the first terminal 31 of the organic light-emitting element. Accordingly, the reset of the first terminal 31 of the organic light-emitting element may be completed.

In a feasible implementation, the first plate 41 of the compensation capacitor C2 may be electrically connected to the second reset module 600 to realize the electrical connection between the first plate 41 of the compensation capacitor C2 and the reset signal line Vref to realize the compensation of the compensation capacitor C2. The specific implementation of the reset of the compensation capacitor C2 may be as follows.

Referring to FIG. 18, when the second reset module 600 includes the sixth transistor M6, at least one driving circuit may also include a control transistor M7. The gate electrode of the control transistor M7 may be connected to a same control signal line as the second reset module 600 (the first scan signal line Scan1 or the second scanning signal line Scan2). The first terminal of the control transistor M7 may be electrically connected to the first terminal of the sixth transistor M6; and the second terminal of the control transistor M7 may be electrically connected to the first plate 41 of the compensation capacitor C2.

Figure 20:
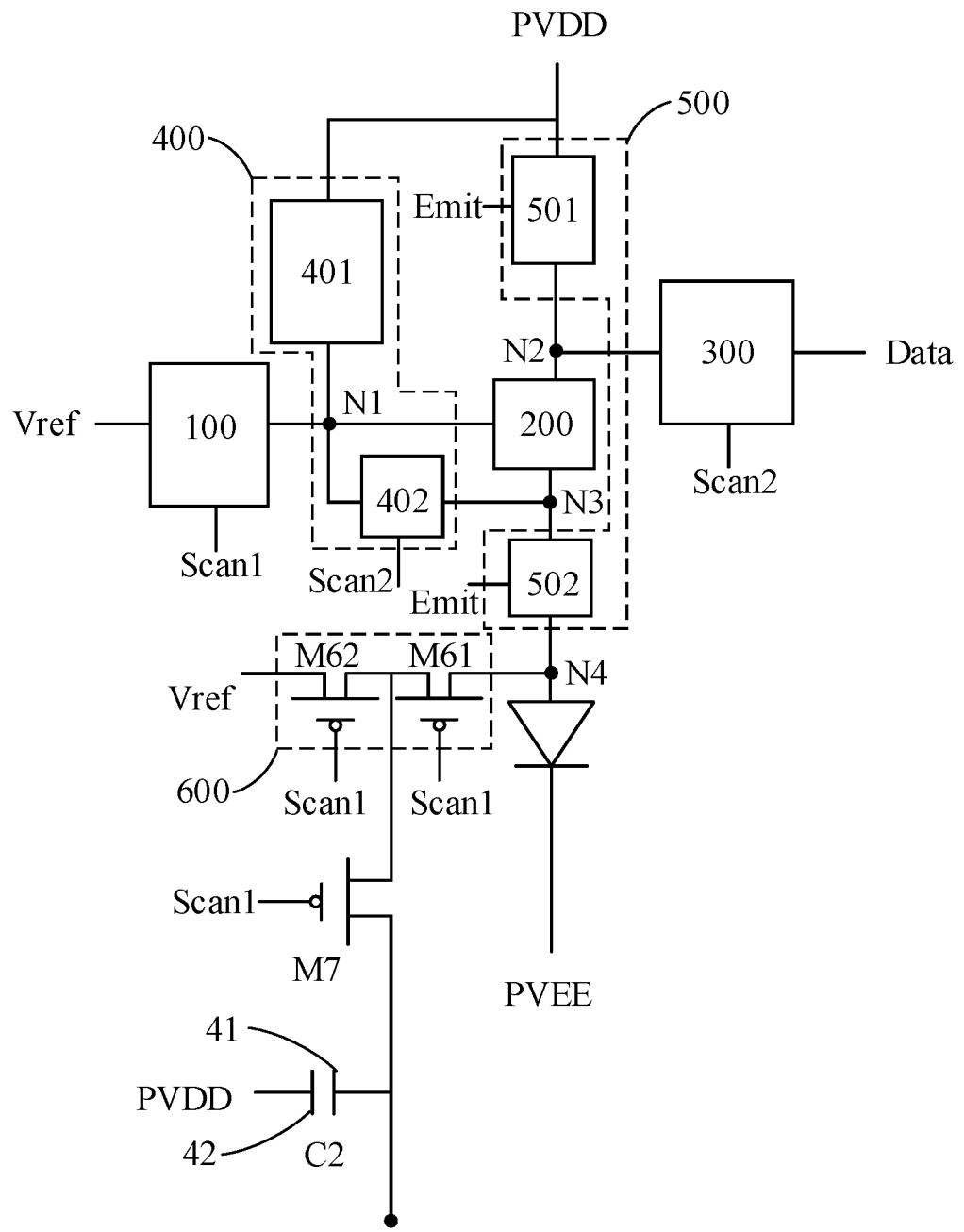
FIG. 20 illustrates an exemplary compensation capacitor under a fifth connection manner according to various disclosed embodiments of the present disclosure.

Referring to FIG. 19 and FIG. 20, when the second reset module 600 includes a sixth transistor, and the sixth transistor includes a third sub-transistor M61 and a fourth sub-transistor M62, at least one driving circuit may further include a control transistor M7.

In one embodiment, as shown in FIG. 0.19, the gate electrode of the control transistor M7 may be electrically connected to the same control signal line (the first scan signal line Scan1 or the second scan signal line Scan2) as the second reset module 600. The first terminal of the control transistor M7 and the first terminal of the third sub-transistor M61 may be electrically connected. The second terminal of the control transistor M7 may be electrically connected to the first plate 41 of the compensation capacitor C2.

In another embodiment, as shown in FIG. 20, the gate electrode of the control transistor M7 may be connected to a same control signal line (the first scan signal line Scan1 or the second scan signal line Scan2) as the second reset module 600. The first terminal of the control transistor M7 may be electrically connected to the second terminal of the third sub-transistor M61. The first electrode of the fourth sub-transistor M62 and the first electrode may be electrically connected, and the second terminal of the control transistor M7 may be electrically connected to the first plate 41 of the compensation capacitor C2.

Figure 21:
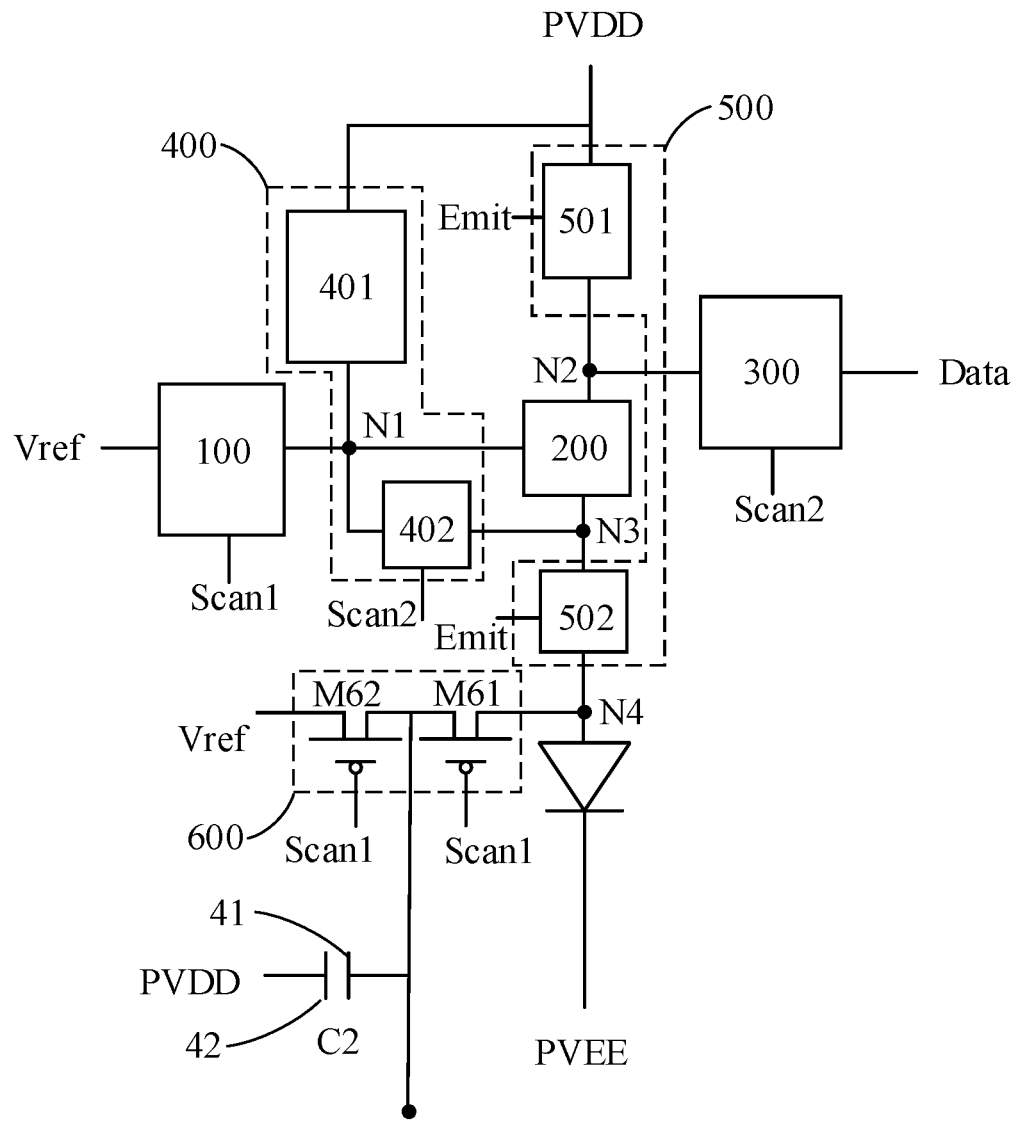
FIG. 21 illustrates an exemplary compensation capacitor under a sixth connection manner according to various disclosed embodiments of the present disclosure.

Referring to FIG. 21, when the second reset module 600 includes a sixth transistor, and the sixth transistor includes a third sub-transistor M61 and a fourth sub-transistor M62, the first plate 41 of the compensation capacitor C2, the second terminal of the third sub-transistor M61 and the first terminal of the fourth sub-transistor M62 may be electrically connected together.

In the above embodiment, the compensation capacitor C2 may be electrically connected to the second reset module 600, and both the compensation capacitor C2 and the second reset module 600 may be controlled by the first scan signal line Scan1 (or the second scan signal line Scan2) such that the second reset module 600 may reset the compensation capacitor C2 when it is in operation. Accordingly, when the second reset module 600 performs the reset, the compensation capacitor C2 may be reset at the same time. For example, the leakage current stored in the compensation capacitor C2 may be released to ensure the storage effect of the storage capacitor C2 to the leakage current compensation after a long-term use.

In the above embodiment, the second reset module 600 may be connected to the first scan signal line Scan1, or the second reset module 600 may be electrically connected to the second scan signal line Scan2 in the adjacent driving circuit. For example, in the two adjacent driving circuits along the arrangement direction of the first scan signal line Scan 1 and the second scanning signal line Scan2, the second reset module 600 in the first driving circuit may be electrically connected to the second scanning signal line Scan2 in the second driving circuit. At this time, the second scan signal line Scan2 may be simultaneously control the second reset module 600 in the first driving circuit and the data writing module 300 in the second driving circuit.

Figure 22:
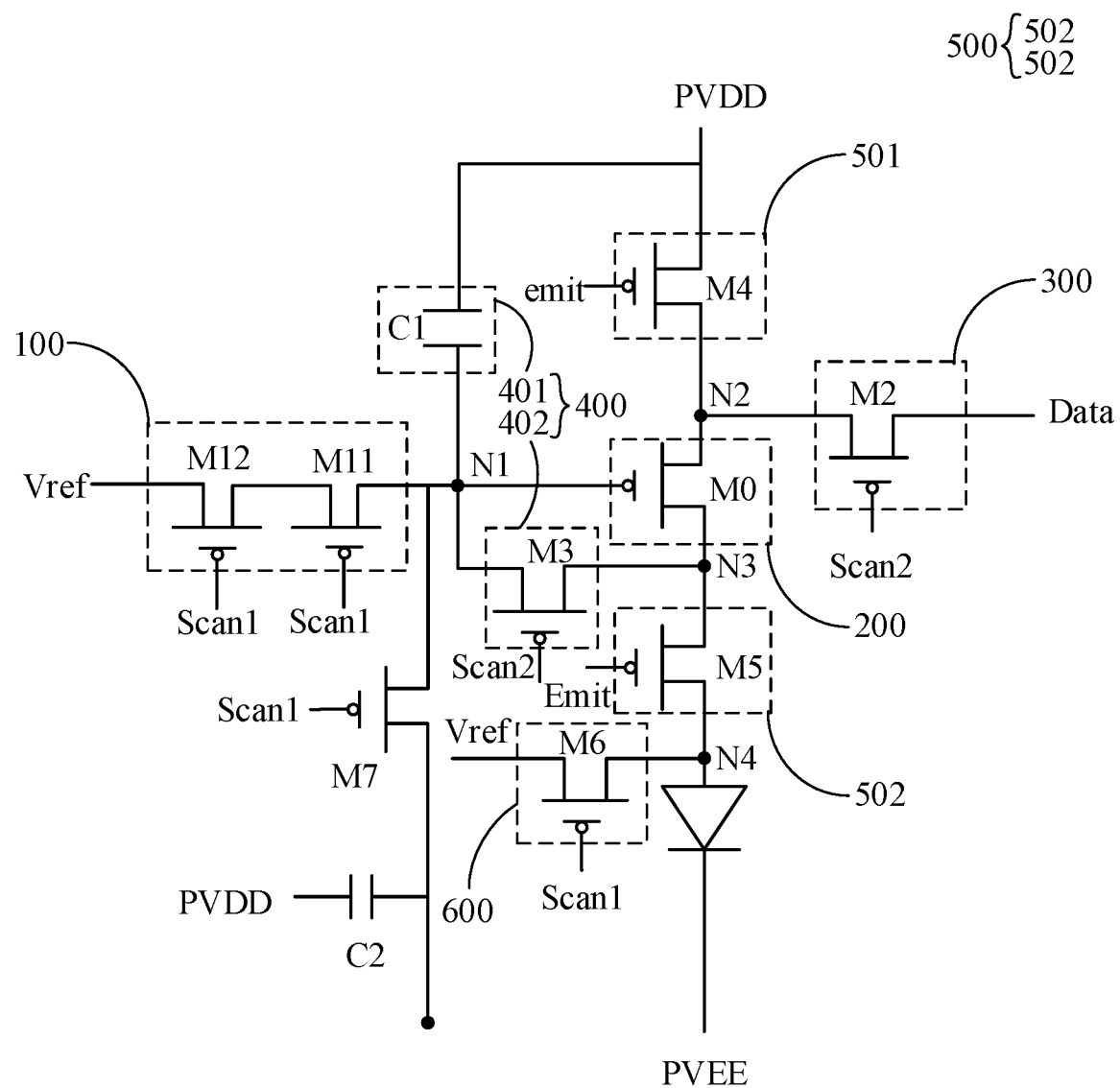
FIG. 22 illustrates an exemplary complete driving circuit according to various disclosed embodiments of the present disclosure.
Figure 23:
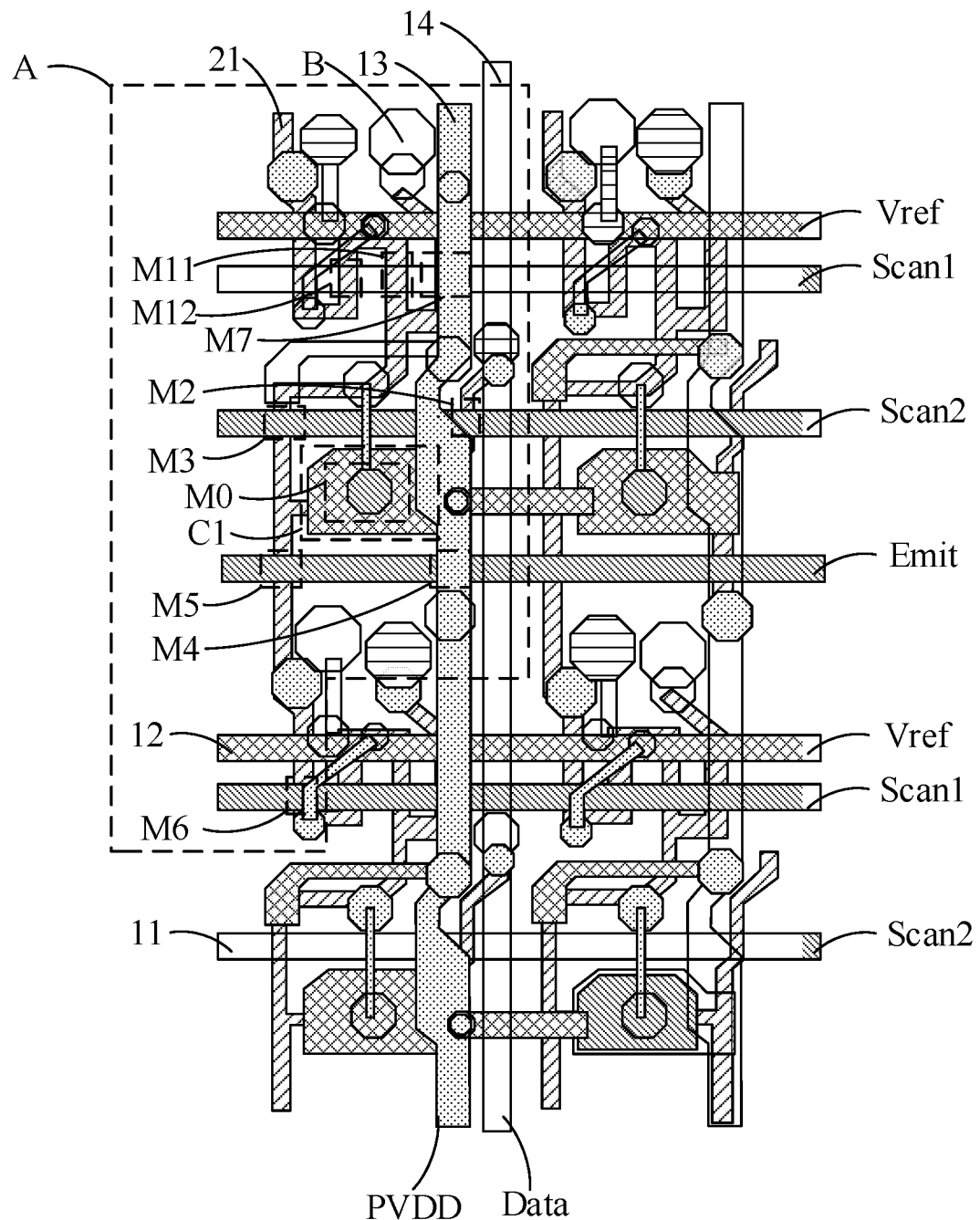
FIG. 23 illustrates a layer structure corresponding to FIG. 22.
Figure 24:
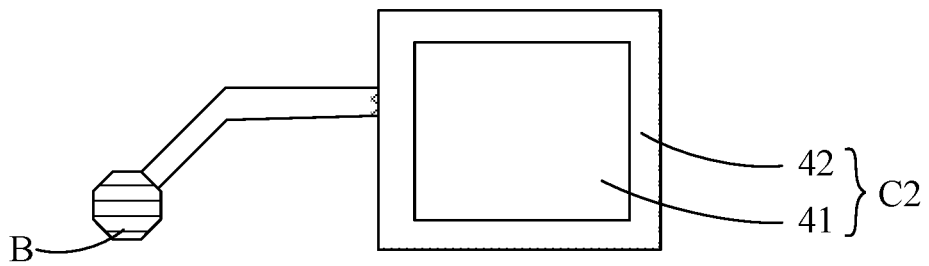
FIG. 24 illustrates an exemplary layer connection relationship of a compensation capacitor according to various disclosed embodiments of the present disclosure.

FIG. 22 illustrates a circuit diagram of anther exemplary driving circuit consistent with various disclosed embodiments of the present disclosure; and a schematic diagram of a film structure corresponding to the driving circuit in FIG. 22 is shown in FIGS. 23-24. The part A in FIG. 23 may correspond to the driving circuit in FIG. 22. The part B in FIG. 24 may be a same structure as the part B in FIG. 23, and may be a connection member for connecting the compensation capacitor C2 and the control transistor M7.

As shown in FIG. 23, the bottom plate 22 of the storage capacitor C1, the gate electrode 23, the first scan signal line Scan1 and the second scan signal line Scan2 may be formed in the first metal layer 11; the top plate 25 of the storage capacitor C1 and the reset signal line Vref may be formed in the second metal layer 12; the first power signal line PVDD may be formed in the third metal layer 13; and the data signal line Data may be formed in the fourth metal layer 14.

In some embodiments, the fourth metal layer 14 may be omitted, and the first power signal line PVDD and the data signal line Data may be both disposed on the third metal layer 13. After the fourth metal layer 14 is added, the data signal line Data may be disposed on the third metal layer 13, the first power signal line PVDD may be disposed on the fourth metal layer 14, or the data signal line Data may be disposed on the third metal layer 13, and the first power signal line PVDD may be partially disposed on the third metal layer 13, and the other portion of the power signal line PVDD may be disposed on the fourth metal layer 14.

The driving circuit in this disclosure is not limited to the above 7T1C circuit without adding the control transistor M7, and may also be 6T2C, 2T1C circuits, etc. The structure of the driving circuit is not particularly limited in this disclosure.

In each embodiment of the present disclosure, transistors are categorized into N-type transistors and P-type transistors. The N-type transistor is turned on under the control of a high-level signal and turned off under the control of a low-level signal. The P-type transistor is turned on under the control of a low-level signal and turned off under the control of a high-level signal. In the pixel circuits provided by the embodiments of the present disclosure, only the P-type transistors are used as examples for description. Further, in each embodiment of the present disclosure, the first terminal of the transistor may be used as its source electrode and the second terminal may be used as its drain electrode according to the type of transistor and the signal at its gate, or the first terminal of the transistor may be used as its drain electrode; the second terminal may serve as its source electrode, and no specific distinction may be made here.

Figure 25:
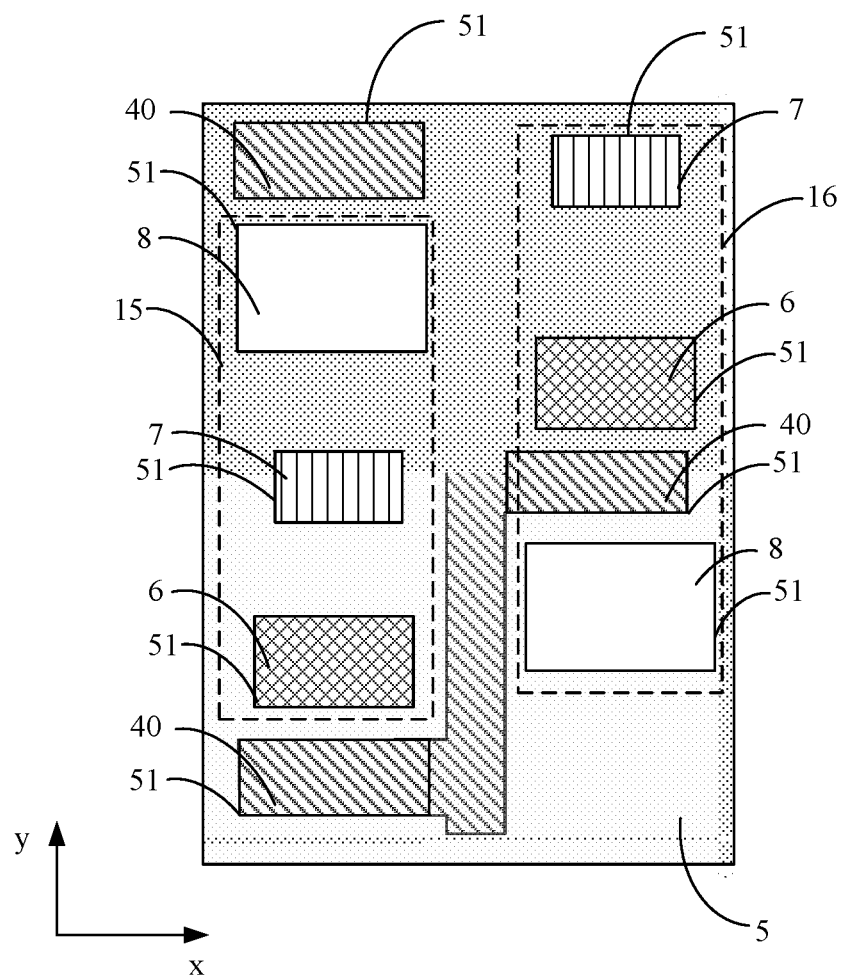
FIG. 25 illustrates an exemplary setting manner of a compensation capacitor according to various disclosed embodiments of the present disclosure.
Figure 26:
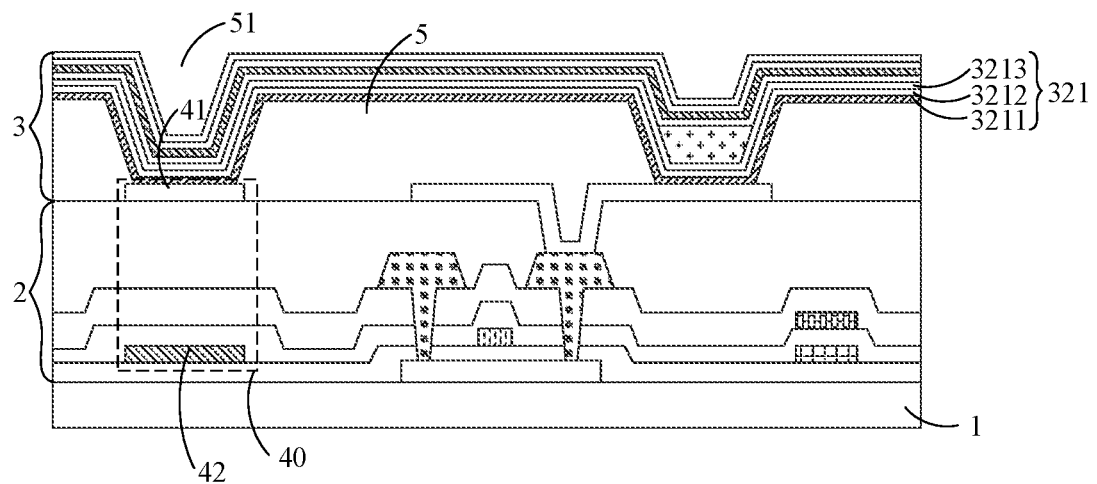
FIG. 26 illustrates another exemplary setting manner of a compensation capacitor according to various disclosed embodiments of the present disclosure.

In one embodiment, as shown in FIGS. 25-26, the display panel may include a compensation capacitor C2. The compensation capacitor C2 may include a plurality of sub-portions 40 disposed between a plurality of pairs of adjacent organic light-emitting elements. The plurality of sub-portions 40 may be connected to each other. The area of the first common layer 321 corresponding to the first electrode plate 41 in each sub-portion 40 may be in contact with the first electrode plate 41 in each sub-portion 40. In one embodiment, as shown in FIG. 13, FIG. 14, FIG. 16, and FIG. 17, the first plate 41 of the compensation capacitor C2 may be connected to the first reset module 100 using the connection manner described in each of these embodiments. In some embodiments, as shown in FIG. 18, FIG. 19, FIG. 20, and FIG. 21, the first plate 41 of the compensation capacitor C2 may be connected to the second reset module 600 using the connection manners described in each of these embodiments.

In one embodiment, each sub-portion 40 of the compensation capacitor C2 may be formed between any two adjacent organic light-emitting elements to prevent a crosstalk between any two organic light-emitting elements. Accordingly, the display effect may be improved.

In another embodiment, each sub-portion 40 of the compensation capacitor C2 may be formed between the red organic light-emitting element 6 and the blue organic light-emitting element 8 to prevent the false light-emitting of the red organic light-emitting element caused by the leakage current generated by the blue organic light-emitting element 8 with a higher turn-on voltage and flowing into the red organic light-emitting element 6 through the first common layer 321. Accordingly, the crosstalk between the red organic light-emitting element 6 and the blue organic light-emitting element 8 may be avoided.

Figure 27:
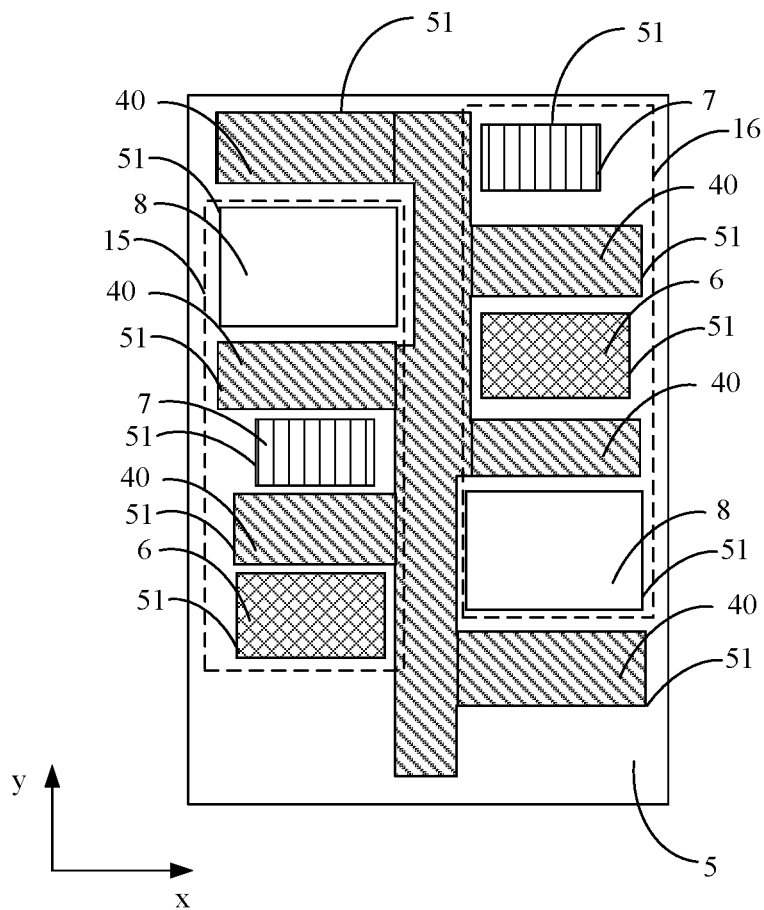
FIG. 27 illustrates another exemplary setting manner of a compensation capacitor according to various disclosed embodiments of the present disclosure.

FIG. 25 and FIG. 27 illustrate exemplary arrangements of the compensation capacitors according to various disclosed embodiments of the present disclosure. As shown in FIG. 25 and FIG. 27, the light-emitting element layer 3 may include a plurality of repeating units. Each repeating unit may include a first organic light-emitting element group 15 and a second organic light-emitting element group 16 arranged along a first direction x. The first organic light-emitting element group 15 and the second organic light-emitting element group 16 may include at least three organic light-emitting elements of different colors arranged along the second direction y. The second direction y may cross the first direction x (for example, the second direction may be perpendicular to the second direction); and the first organic light-emitting element group 15 and the second organic light-emitting element group 16 may be staggered by a predetermined distance along the second direction y. The preset distance may be smaller than the width of any organic light-emitting element along the second direction y. Along the first direction x, adjacent organic light-emitting elements in the first organic light-emitting element group 15 and the second organic light-emitting element group 16 may have different colors. FIG. 25 and FIG. 27 shows one repeating unit, respectively. In FIG. 25 and FIG. 27, the first organic light-emitting element group 15 may include a blue organic light-emitting element 8, a green organic light-emitting element 7, and a red organic light-emitting element 6 arranged along the second direction y. The second organic light-emitting element group 16 may include a green organic light-emitting element 7, a red organic light-emitting element 6, and a blue organic light-emitting element 8 arranged along the second direction y.

In the above embodiment, each compensation capacitor C2 may be formed only between the red organic light-emitting element 6 and the blue organic light-emitting element 8, as shown in FIG. 25, to effectively prevent the blue organic light-emitting element 8 with a higher turn-on voltage from affecting the light-emitting effect of the adjacent red light-emitting element 6. In some embodiments, as shown in FIG. 27, each compensation capacitor C2 may be formed between any two adjacent organic light-emitting elements. Accordingly, the crosstalk occurring between the adjacent organic light-emitting elements may be effectively prevented.

Figure 28:
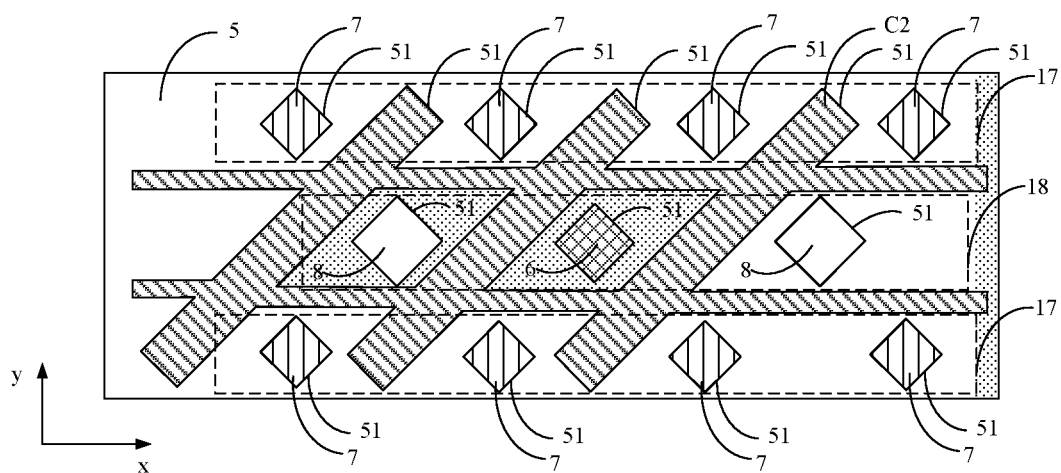
FIG. 28 illustrates another exemplary setting manner of a compensation capacitor according to various disclosed embodiments of the present disclosure.
Figure 29:
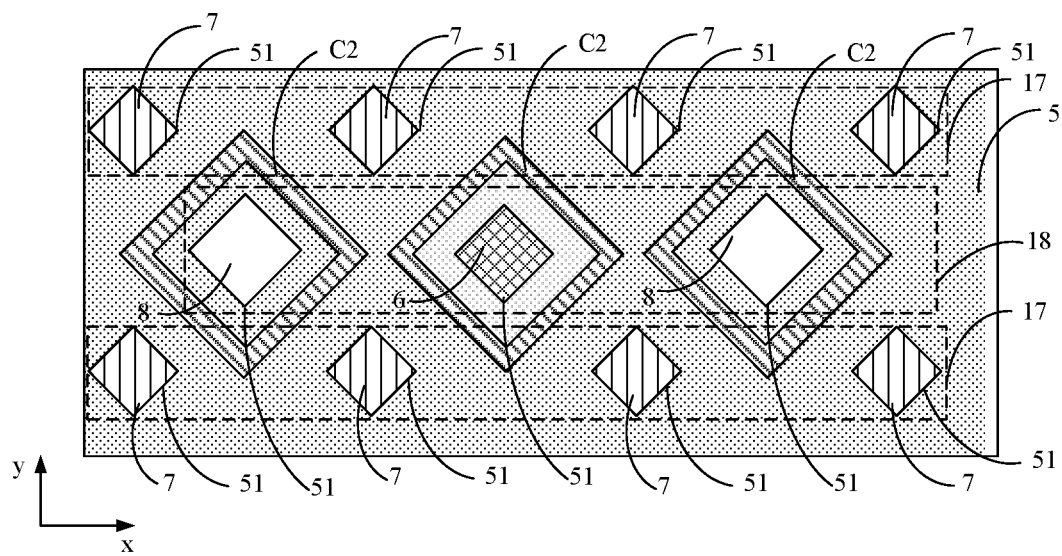
FIG. 29 illustrates another exemplary setting manner of a compensation capacitor according to various disclosed embodiments of the present disclosure.

FIGS. 28-29 illustrate other exemplary arrangements of the compensation capacitors according to various disclosed embodiments of the present disclosure. As shown in FIGS. 28-29, the light-emitting element layer 3 may include a first organic light-emitting element row 17 and a second organic light-emitting element row 18. The first organic light-emitting element row 17 may include a plurality of green organic light-emitting elements 7 arranged along a first direction x; and the second organic light-emitting element row 18 may include blue organic light-emitting elements 8 and red organic light-emitting elements 6 alternately arranged along the first direction x. The first organic light-emitting element row 17 and the second organic light-emitting element row 18 may be staggered along the second direction y. The second direction y may intersect the first direction x (the configuration that the second direction y is perpendicular to the first direction x is used as an example for the description). The first organic light-emitting element row 17 and the second organic light emitting element row 18 may be staggered by a predetermined distance along the first direction x, and the predetermined distance may be smaller than the width of the green organic light-emitting element 7 along the first direction x.

Figure 30:
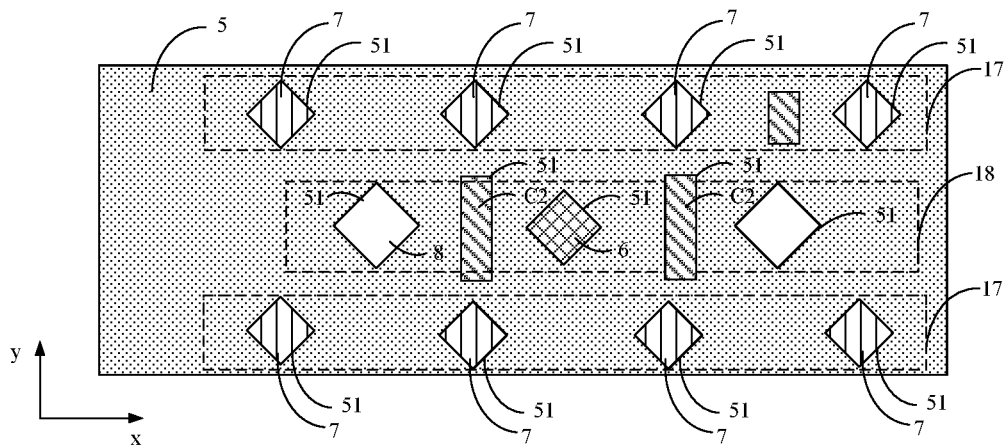
FIG. 30 illustrates another exemplary setting manner of a compensation capacitor according to various disclosed embodiments of the present disclosure.

In one embodiment, as shown in FIG. 29, each compensation capacitor C2 may be arranged around each organic light-emitting element to avoid a crosstalk between any adjacent organic light-emitting elements. In another embodiment, as shown in FIG. 30, each compensation capacitor C2 may be arranged around each of the red organic light-emitting elements 6 and the blue organic light-emitting elements 8. Such a configuration may be relatively simple, and the crosstalk between adjacent organic light-emitting elements may be effectively prevented.

In some embodiments, the display panel may include a plurality of compensation capacitors C2. The area of the first common layer 32 corresponding to the first plate 41 of each compensation capacitor C2 may be in contact with the first electrode plate 41 of each compensation capacitor C2. As show in FIG. 30, the plurality of compensation capacitors C2 may be arranged in parallel.

In the above embodiments, the first plate 41 of each compensation capacitor C2 and the first reset module 100 may be connected to each other using various different connection manners, or the first plate 41 of the above compensation capacitor C2 and the second reset module 600 may be connect to each with the previous described manners. At the same time, the driving circuit layer 2 in the present disclosure may include at least one driving circuit. When the plurality of compensation capacitors C2 are included, the first plate 41 of each compensation capacitor C2 may be connected to one driving circuit. When the driving circuit layer 2 includes multiple driving circuits, the first plate 41 of each compensation capacitor C2 may be connected to each driving circuit in a one-to-one correspondence. For example, one driving circuit may be connected to only one compensation capacitor C2.

Figure 31:
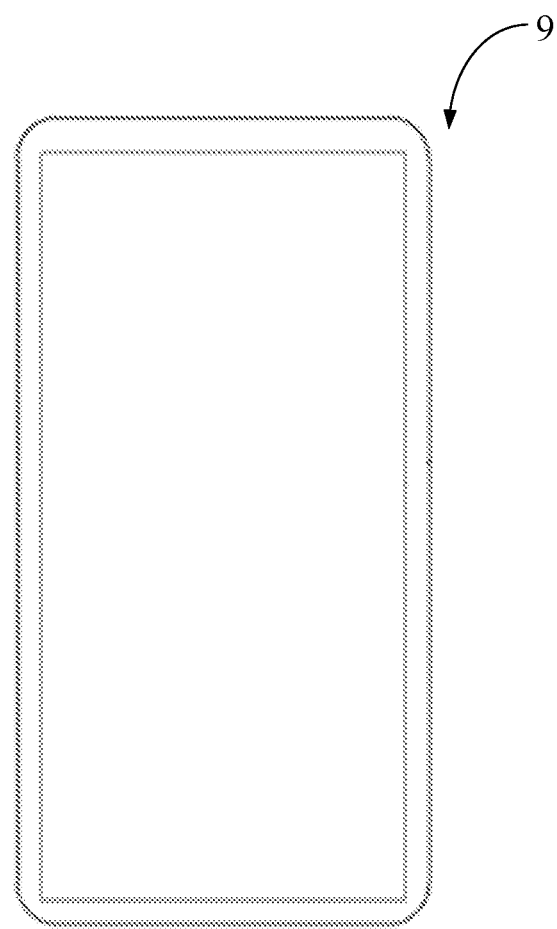
FIG. 31 illustrates an exemplary display device according to various disclosed embodiments of present disclosure.

The present disclosure also provides a display device. FIG. 31 illustrates an exemplary display device 9 according to one embodiment of the present disclosure.

As shown in FIG. 31, the display device 9 may include a present disclosed display panel, or other appropriate display panel. The display panel may be a mobile terminal, such as a mobile phone and a tablet computer, etc., or a fixed terminal, such as a TV set, a display etc. Because the display device provided in the present disclosure may include the present disclosed display panel, the phenomenon of display cross-color may be prevented, and the display effect may be improved.

The above are only specific implementations of the present disclosure. Those skilled in the art can clearly understand that for the convenience and conciseness of description, the specific working process of the above-described system, module and unit can be referred to in the foregoing method embodiment. The corresponding process will not be repeated here. It should be understood that the protection scope of the present disclosure is not limited to this, and anyone familiar with the technical field.

What is claimed is:

1. A display panel, comprising:
a substrate;
a driving circuit layer, disposed on the substrate and including a reset signal line and a first power signal line;
a light-emitting element layer, including a plurality of organic light-emitting elements, wherein each of the plurality of organic light-emitting elements includes a first electrode, a light-emitting layer, and a second electrode, disposed on the driving circuit layer, and the light-emitting layer includes a first common layer, a light-emitting material layer and a second common layer; and
a compensation capacitor, disposed between at least two adjacent organic light-emitting elements of the plurality of light-emitting elements, wherein the compensation capacitor includes a first plate and a second plate that are insulated from each other, the first plate is disposed on a side of the first common layer facing the substrate and is in contact with the first common layer, the first plate is electrically connected with the reset signal line, and the second plate is electrically connected with the first power signal line.

2. The display panel according to claim 1, wherein:
the first plate and the first electrode are disposed in a same layer;
the display panel further includes a pixel definition layer formed on a side of the first electrode away from the substrate;
the first common layer is formed on a side of the pixel definition layer away from the substrate;
the pixel definition layer includes at least one first opening; and
along a direction perpendicular to a plane where the substrate is located, the first opening and the first electrode at least partially overlap.

3. The display panel according to claim 1, wherein:
along a direction away from the substrate, the first common layer includes at least a hole injection layer and a hole transport layer, and the second common layer includes at least an electron transport layer and an electron injection layer.

4. The display panel according to claim 1, wherein:
along a direction away from the substrate, the driving circuit layer includes an active layer, a first metal layer, a second metal layer, and a third metal layer, and a first insulation layer disposed between the active layer and the first metal layer, a second insulation layer disposed between the first metal layer and the second metal layer, a third insulation layer disposed between the second metal layer and the third metal layer, and a planarization layer disposed between the third metal layer and the light-emitting element layer.

5. The display panel according to claim 4, wherein:
the second plate is disposed on at least one of the first metal layer, the second metal layer, and the third metal layer.

6. The display panel according to claim 4, wherein the driving circuit layer further comprises:
a fourth insulation layer disposed on a side of the third metal layer away from the third insulation layer; and
a fourth metal layer disposed on a side of the fourth insulation layer away from the third metal layer,
wherein at least a portion of the second plate is disposed on the fourth metal layer.

7. The display panel according to claim 6, wherein:
along the direction away from the substrate, the fourth metal layer includes a first titanium layer, an aluminum layer, and a second titanium layer, or the fourth metal layer includes a molybdenum layer.

8. The display panel according to claim 1, wherein:
the display panel includes one compensation capacitor, wherein the compensation capacitor includes a plurality of sub-portions each disposed between a plurality of adjacent pairs of organic light-emitting elements of the plurality of organic light-emitting elements, the plurality of sub-portions are connected to each other, and an area of the first common layer corresponding to the first plate of each of the plurality of sub-portions is in contact with the first plate of the each of the plurality of sub-portions; or
the display panel includes a plurality of the compensation capacitors, and an area of the first common layer corresponding to the first plate of each of the plurality of compensation capacitors is in contact with the first plate of the each of the plurality of compensation capacitors, and the plurality of the compensation capacitors are arranged in parallel.

9. The display panel according to claim 1, wherein:
the driving circuit layer includes a plurality of driving circuits;
each of the plurality of driving circuits is correspondingly connected to at least one of the plurality of organic light-emitting elements; and
the each of the plurality of driving circuits includes a data writing module, a threshold compensation module, a light-emitting control module, a first reset module, a second reset module and a driving module,
wherein:
a first terminal of the first reset module is electrically connected to a first node, a second terminal of the first reset module is electrically connected to the reset signal line, and a control terminal of the first reset module is electrically connected to a first scan signal line;
a control terminal of the driving module is electrically connected to the first node, a first terminal of the driving module is electrically connected to a second node, and a second terminal of the driving module is electrically connected to a third node;
a first terminal of the data writing module is electrically connected to the second node, a second terminal of the data writing module is electrically connected to a data signal line, and a control terminal of the data writing module is electrically connected to a second scan signal line;
the threshold compensation module includes a first sub-module and a second sub-module, wherein:
a first terminal of the first sub-module is electrically connected to the first power signal line, a second terminal of the first sub-module is electrically connected to the first node, a first terminal of the second sub-module is electrically connected to the first node, a second terminal of the second sub-module is electrically connected to the third node, and a control terminal of the second sub-module is electrically connected to the second scanning signal line;
the light-emitting control module includes a first light-emitting control sub-module and a second light-emitting control sub-module,
wherein:
a first terminal of the first light-emitting control sub-module is electrically connected to the first power signal line, and a second terminal of the first light-emitting control sub-module is electrically connected to the second node, a control terminal of the first light-emitting control sub-module is electrically connected to a light-emitting control signal line, a first terminal of the second light-emitting control sub-module is electrically connected to the third node, a second terminal of the second light-emitting control sub-module is electrically connected to a fourth node, and a control terminal of the second light-emitting control sub-module is electrically connected to the light-emitting control signal line;
a first terminal of the second reset module is electrically connected to the fourth node, a second terminal of the second reset module is electrically connected to the reset signal line, and a control terminal of the second reset module is electrically connected to the first scan line; and
a first terminal of the organic light-emitting element is electrically connected to the fourth node.

10. The display panel according to claim 9, wherein the first reset module comprises:
a first transistor,
wherein a gate electrode of the first transistor is electrically connected to the first scan signal line, a first terminal of the first transistor is electrically connected to the first node, and a second terminal of the first transistor is electrically connected to the reset signal line.

11. The display panel according to claim 10, wherein:
at least one driving circuit further includes a control transistor,
wherein a gate electrode of the control transistor is electrically connected to the first scan signal line, a first terminal of the control transistor is electrically connected to the first terminal of the first transistor, and a second terminal of the control transistor is electrically connected to the first plate of the compensation capacitor.

12. The display panel according to claim 9, wherein:
the first reset module includes a first transistor; and
the first transistor includes a first sub-transistor and a second sub-transistor,
wherein a second terminal of the first sub-transistor is electrically connected to a first terminal of the second sub-transistor, a gate electrode of the first sub-transistor and a gate electrode of the second sub-transistor are both electrically connected to the first scan signal line, a first terminal of the first sub-transistor is electrically connected to the first node, and a second terminal of the second sub-transistor is electrically connected to the reset signal line.

13. The display panel according to claim 12, wherein:
at least one driving circuit further includes a control transistor,
wherein:
a gate electrode of the control transistor is electrically connected to the first scan signal line, a first terminal of the control transistor is electrically connected to a second terminal of the first sub-transistor and a first terminal of the second sub-transistor and a second terminal of the control transistor is electrically connected to the first plate of the compensation capacitor; or
the gate electrode of the control transistor is electrically connected to the first scan signal line, the first terminal of the control transistor is electrically connected to the first terminal of the first sub-transistor, and the second terminal of the control transistor is electrically connected to the first plate of the compensation capacitor.

14. The display panel according to claim 9, wherein:
the driving module includes a driving transistor,
wherein a gate electrode of the driving transistor is the control terminal of the driving module, a first terminal of the driving transistor is the first terminal of the driving module, and a second terminal of the driving transistor is the second terminal of the driving module.

15. The display panel according to claim 9, wherein:
the data writing module includes a second transistor,
wherein a gate electrode of the second transistor is electrically connected to the second scan signal line, and a first terminal of the second transistor is electrically connected to the data signal line.

16. The display panel according to claim 9, wherein:
the first sub-module includes a storage capacitor;
the storage capacitor includes a third plate and a fourth plate; and
the second sub-module includes a third transistor,
wherein:
a gate electrode of the third transistor is electrically connected with the second scan signal line, a first terminal of the third transistor is electrically connected with the first node, and a second terminal of the third transistor is electrically connected to the third node; and
the third plate of the storage capacitor is electrically connected with the first power signal line, and the fourth plate of the storage capacitor is electrically connected with the first node.

17. The display panel according to claim 9, wherein:
the first light-emitting control sub-module includes a fourth transistor; and
the second light-emitting control sub-module includes a fifth transistor,
wherein:
a gate electrode of the fourth transistor is electrically connected with the light-emitting control signal line, a first terminal of the fourth transistor is electrically connected with the first power signal line, and the second terminal of the fourth transistor is electrically connected with the second node; and
a gate electrode of the fifth transistor is electrically connected with the light-emitting control signal line, a first terminal of the fifth transistor is electrically connected with the third node, and a second terminal of the fifth transistor is electrically connected with the fourth node.

18. The display panel according to claim 9, wherein:
the second reset module includes a sixth transistor,
wherein a gate electrode of the sixth transistor is electrically connected with the first scan signal line, a first terminal of the sixth transistor is electrically connected with the fourth node, and a second terminal of the sixth transistor is electrically connected to the reset signal line; and
at least one driving circuit further includes a control transistor,
wherein a gate electrode of the control transistor is electrically connected with the first scan signal line, a first terminal of the control transistor is electrically connected to the first terminal of the sixth transistor, and a second terminal of the control transistor is electrically connected to the first plate of the compensation capacitor.

19. The display panel according to claim 9, wherein:
the second reset module includes a sixth transistor;
the sixth transistor includes a third sub-transistor and a fourth sub-transistor,
wherein:
a second terminal of the third sub-transistor is electrically connected with the first terminal of the fourth transistor, a gate electrode of the third sub-transistor and a gate electrode of the fourth sub-transistor are both electrically connected to the first scan signal line, a first terminal of the third sub-transistor is electrically connected with the fourth node, and a second terminal of the fourth sub-transistor is electrically connected with the reset signal line; and
at least one driving circuit further includes a control transistor,
wherein:
a gate electrode of the control transistor is electrically connected with the first scan signal line, a first terminal of the control transistor is electrically connected with the first terminal of the third sub-transistor, and a second terminal of the control transistor is electrically connected with the first plate of the compensation capacitor; or
the gate electrode of the control transistor is electrically connected with the first scan signal line, the first terminal of the control transistor is electrically connected to the second terminal of the third sub-transistor and the first terminal of the fourth sub-transistor, and the second terminal of the control transistor is electrically connected to the first plate of the compensation capacitor.

20. A display device, comprising:
a display panel,
wherein the display panel includes:
a substrate;
a driving circuit layer, disposed on the substrate and including a reset signal line and a first power signal line;
a light-emitting element layer, including a plurality of organic light-emitting elements, wherein each of the plurality of organic light-emitting elements includes a first electrode, a light-emitting layer, and a second electrode disposed on the driving circuit layer, and the light-emitting layer includes a first common layer, a light-emitting material layer and a second common layer; and a compensation capacitor, disposed between at least two adjacent organic light-emitting elements of the plurality of light-emitting elements, wherein the compensation capacitor includes a first plate and a second plate that are insulated from each other, the first plate is disposed on a side of the first common layer facing the substrate and in contact with the first common layer, the first plate is electrically connected with the reset signal line, and the second plate is electrically connected with the first power signal line.

* * * * *